(12) United States Patent
Yang et al.

(10) Patent No.: US 10,559,370 B2
(45) Date of Patent: Feb. 11, 2020

(54) SYSTEM AND METHOD FOR IN-SITU PROGRAMMING AND READ OPERATION ADJUSTMENTS IN A NON-VOLATILE MEMORY

(71) Applicant: SanDisk Technologies LLC, Plano, TX (US)

(72) Inventors: Xiang Yang, Santa Clara, CA (US); Piyush Dak, San Jose, CA (US); Wei Zhao, Fremont, CA (US); Huai-Yuan Tseng, San Ramon, CA (US); Deepanshu Dutta, Fremont, CA (US); Mohan Dunga, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/928,976

(22) Filed: Mar. 22, 2018

(65) Prior Publication Data
US 2019/0295669 A1 Sep. 26, 2019

(51) Int. Cl.
| | |
|---|---|
| G11C 16/06 | (2006.01) |
| G11C 16/34 | (2006.01) |
| G11C 16/32 | (2006.01) |
| G11C 16/26 | (2006.01) |
| G11C 16/10 | (2006.01) |
| G11C 16/24 | (2006.01) |
| G11C 11/56 | (2006.01) |
| G11C 16/04 | (2006.01) |

(52) U.S. Cl.
CPC .......... G11C 16/3459 (2013.01); G11C 16/10 (2013.01); G11C 16/26 (2013.01); G11C 16/32 (2013.01); *G11C 11/5628* (2013.01); *G11C 11/5642* (2013.01); *G11C 11/5671* (2013.01); *G11C 16/0483* (2013.01); *G11C 16/24* (2013.01)

(58) Field of Classification Search
CPC .. G11C 16/3459; G11C 11/5642; G11C 16/32
See application file for complete search history.

(56) References Cited

U.S. PATENT DOCUMENTS

| 9,009,568 B2 | 4/2015 | Luo et al. |
| 9,224,502 B1 | 12/2015 | Sabde et al. |

(Continued)

OTHER PUBLICATIONS

U.S. Appl. No. 15/430,299, filed Feb. 10, 2017.

*Primary Examiner* — Uyen Smet
(74) *Attorney, Agent, or Firm* — Foley & Lardner LLP

(57) ABSTRACT

A circuit includes a detection circuit configured to determine a capacitance delay (RC-delay) in an initial stage of a read or program operation and to adjust timing for detecting data in a subsequent stage, or portion of a stage, of the same read or programming operation. In particular, during a program operation a detection circuit may be configured to detect a pre-charge time for a bit line and adjust a timing of subsequent verify stages of the bit line during the same program operation based on the detected pre-charge time. Additionally, a word line circuit may be configured to detect a pre-charge time for a word line during an initial stage of a read operation and adjust read timing for a subsequent portion of the same read stage, or subsequent read stage of the read operation based on the detected word line pre-charge time.

16 Claims, 18 Drawing Sheets

(56) References Cited

U.S. PATENT DOCUMENTS

| | | |
|---|---|---|
| 9,460,805 B1 | 10/2016 | Pang et al. |
| 2004/0032778 A1* | 2/2004 | Yamashita .............. G06F 11/00 |
| | | 365/220 |
| 2008/0298133 A1* | 12/2008 | Kim ................... G11C 16/3436 |
| | | 365/185.22 |
| 2010/0131809 A1 | 5/2010 | Katz |
| 2014/0289559 A1 | 9/2014 | Hashimoto |

* cited by examiner

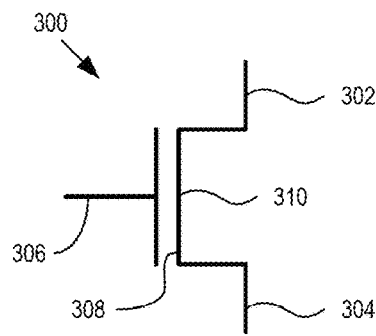
FIG. 3
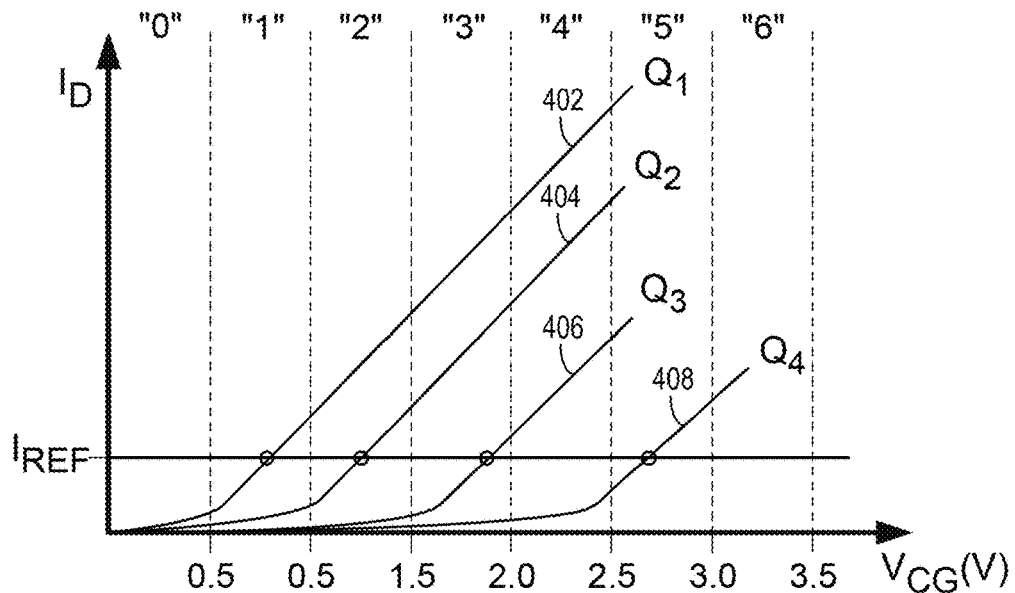
FIG. 4
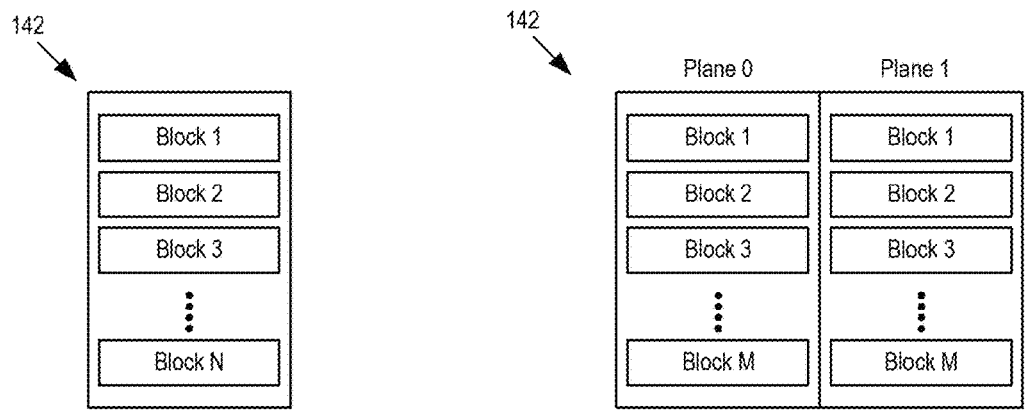
FIG. 5A
FIG. 5B

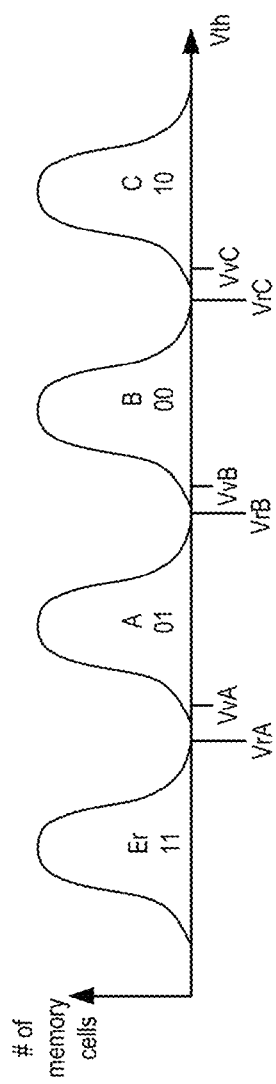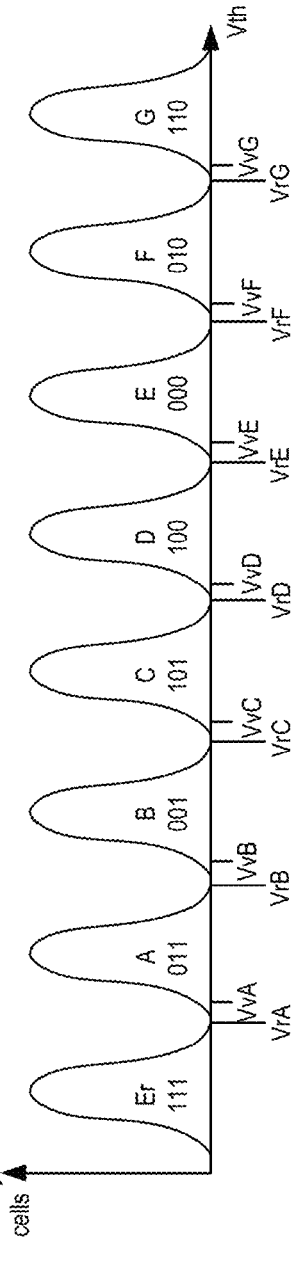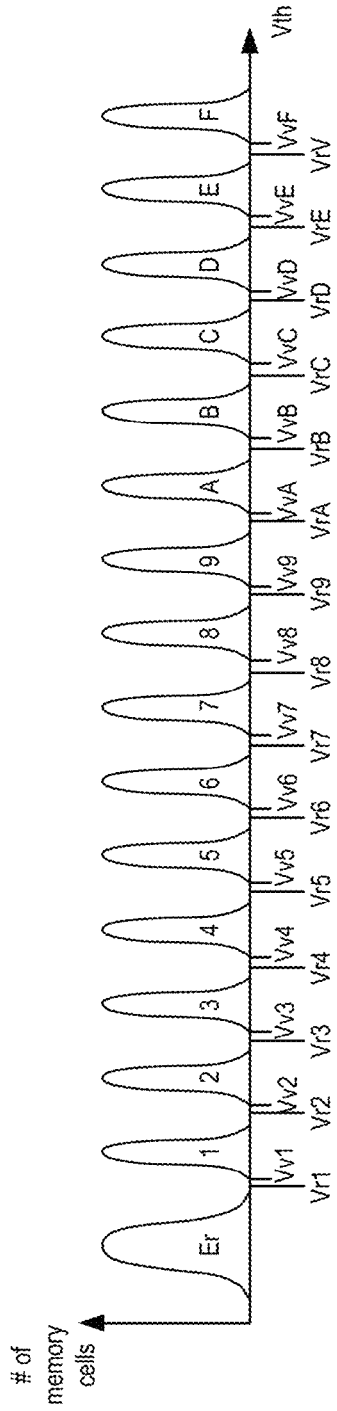
FIG. 9A
FIG. 9B
FIG. 9C

| Measured Bit Line Pre-Charge Time | Bit Line Settling Time (First Verify Stage) | ... | Bit Line Settling Time (Nth Verify Stage) |
|---|---|---|---|
| ... | ... | | ... |
| 8 μs | 15 μs – 6.40 μs | | 18 μs – 6.40 μs |
| 9 μs | 15 μs – 5.12 μs | | 18 μs – 5.12 μs |
| 10 μs | 15 μs – 3.84 μs | ... | 18 μs – 3.84 μs |
| 11 μs | 15 μs – 2.56 μs | | 18 μs – 2.56 μs |
| 12 μs | 15 μs – 1.28 μs | | 18 μs – 1.28 μs |
| 13 μs | 15 μs | | 18 μs |
| 14 μs | 15 μs + 1.28 μs | | 18 μs + 1.28 μs |
| ... | ... | | ... |

| Measured Word Charge Time | WL Settling Time (First Read Stage) | WL Settling Time (Nth Verify Stage) |
|---|---|---|
| ... | ... | ... |
| 1.36 μs | 10 μs – 6.40 μs | 6 μs – 6.40 μs |
| 2 μs | 10 μs – 5.12 μs | 6 μs – 5.12 μs |
| 2.64 μs | 10 μs – 3.84 μs | 6 μs – 3.84 μs |
| 3.28 μs | 10 μs – 2.56 μs | 6 μs – 2.56 μs |
| 3.92 μs | 10 μs – 1.28 μs | 6 μs – 1.28 μs |
| 4.56 μs | 10 μs | 6 μs |
| 5.2 μs | 10 μs + 1.28 μs | 6 μs + 1.28 μs |
| ... | ... | ... |

FIG. 18

SYSTEM AND METHOD FOR IN-SITU PROGRAMMING AND READ OPERATION ADJUSTMENTS IN A NON-VOLATILE MEMORY

BACKGROUND

As storage devices continue to be fabricated with increased storage density and decreased physical size, the time needed to reliably complete programming or read operations in the non-volatile memory cells of those storage devices can vary greatly. The variance in read and/or program operation time can vary on a lot-by-lot, die-by-die and/or on a smaller scale within a die due to process variations at the manufacturing stage. Separately or in addition to manufacturing variations, the read and program operation times of higher density memory devices can be affected by data pattern variations. For example, the differing combinations of high or low voltages applied to a particular block of non-volatile memory can lead to capacitive coupling between adjacent bit lines or word lines that can influence programming and read operation times. Similarly, operating temperature variations can lead to different read or program operation times between particular die, bit lines or word lines. Efforts to detect read or programming errors and adjust one or more timing parameters of a memory device can often introduce significant delay in the execution of read and program operations that may outweigh the benefits.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3 is a circuit diagram of an example floating gate transistor.

FIG. 4 is a graph of curves of drain-to-source current as a function of control gate voltage drawn through a floating gate transistor.

FIG. 5A is a block diagram of a plurality of memory cells organized into blocks.

FIG. 5B is a block diagram of a plurality of memory cells organized into blocks in different planes.

FIG. 9A is a plot of threshold voltage distribution curves for memory cells storing two bits of data.

FIG. 9B is a plot of threshold voltage distribution curves for memory cells storing three bits of data.

FIG. 9C is a plot of threshold voltage distribution curves for memory cells storing four bits of data.

FIG. 18 illustrates an example table suitable for use in the timing circuit of FIG. 11, showing measured initial word line charge times and corresponding word line settling time settings for multiple read stages of a read operation.

DETAILED DESCRIPTION

Figure 1A:
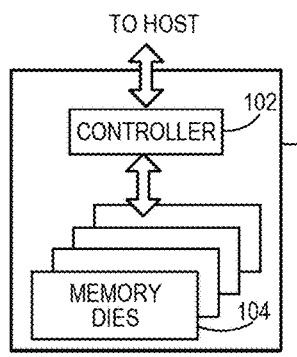
FIG. 1A is a block diagram of an exemplary non-volatile memory system.

By way of introduction, the below embodiments relate to apparatus, devices, systems, circuits, and methods for performing real-time, self-adaptive bit line and word line program and read timing adjustments to adapt for the effects of manufacturing, device configuration, temperature and data pattern variations on programming and read operations. The real-time and self-adaptive aspects may be accomplished in the disclosed apparatus, devices, systems, circuits, and methods, by measuring how fast or slow the bit line or word line is during an initial stage of a multiple stage read or program-verify operation, and then applying one or more adjustments to later portions of the same or later stages of the same read or program-verify operation. One example disclosed below measures the performance of a selected bit line (program operation) or word line (read operation) and, by measuring the time the bit line or word line takes to charge up to a respective predetermined threshold voltage, creates one or more adjustments for later portions of the read or program-verify operation as a function of the currently measured speed of the bit line or word line. The adjustments to the timing may be applied to later stages of the same currently executing read or program-verify operation.

According to one aspect, a circuit is provided having a detection circuit configured to detect a time duration for a bit line voltage of a bit line to reach a predetermined threshold voltage level during a pre-charge stage of a program-verify operation for a memory cell coupled to the bit line. The circuit further includes a timing circuit configured to, based on the time duration detected, set a verify time during a verify stage of the program-verify operation.

In another aspect, a system is disclosed having a memory array comprising a plurality of memory cells and a plurality of bit lines connected to the plurality of memory cells. The system further includes a detection circuit configured to detect a time duration for a bit line voltage of a bit line of the plurality of bit lines to reach a threshold voltage level during a pre-charge stage of a program-verify operation. A timing circuit in the system is configured to, during the program operation, determine a bit line settling time period for a verify stage of the program-verify operation corresponding to the detected time duration from a buffer associating a plurality of bit line settling time periods with a plurality of time durations of the pre-charge stage. Also, a sense circuit in the system is connected to the bit line, where the sense circuit is configured to, during the verify stage, sense a status of a memory cell coupled to the bit line relative to the bit line settling time period.

In another aspect a circuit is disclosed having a detection circuit, a timing circuit and a sense circuit. The detection circuit is configured to detect a time duration for a word line voltage of a word line to reach a threshold voltage level during a word line charging portion of a read operation for a memory cell coupled to the word line. The timing circuit is configured to identify a word line settling time period for the word line during a read stage of the read operation based on the time duration detected. The sense circuit is configured to sense a program state of the memory cell during the read stage relative to the identified word line settling time period.

According to another aspect, a circuit is disclosed including detecting means for detecting a time duration for a bit line voltage to reach a threshold level during a pre-charge stage of a program-verify operation, setting means for setting a verify time in a verify stage of the program-verify operation and sensing means for sensing a status of a target memory cell relative to the verify time.

In yet another aspect, a method is described. The method may include detecting, with a detection circuit, a time at which a bit line voltage increasing from an initial level reaches a threshold level during a pre-charge stage of a program-verify operation. The method also may include outputting, with the detection circuit, a state change signal in response to detecting that the bit line voltage reached the threshold level. The method may further include tracking, with a counter, a number of clock pulses of a clock signal from a beginning of the pre-charge stage to when the state change signal indicates that the bit line voltage reached the threshold level. The method may also include selecting, with verify logic, a bit line settling time period based on the number of clock pulses, and outputting, with a sense circuit controller, a control signal to a sense circuit in response to expiration of the bit line settling time period.

In another aspect, an additional method is described. The method may include detecting, with a detection circuit, a time at which a word line voltage increasing from an initial level reaches a threshold level during application of a read spike voltage in an initial read stage of a read operation. The method may also include outputting, with the detection circuit, a state change signal in response to detecting that the word line voltage reached the threshold level. The method may further include tracking, with a counter, a number of clock pulses of a clock signal from a beginning of application of the read spike voltage during the initial read stage to when the state change signal indicates that the word line voltage has reached the threshold level. The method may also include selecting, with read logic, a word line settling time period based on the number of clock pulses, and outputting, with a sense circuit controller, a control signal to a sense circuit in response to expiration of the word line settling time period.

Other embodiments are possible, and each of the embodiments can be used alone or together in combination. Accordingly, various embodiments will now be described with reference to the attached drawings.

The following embodiments describe apparatuses, devices, systems, circuits, and methods for performing dynamically setting time periods during verify stages of program-verify operations and read stages or read operations. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
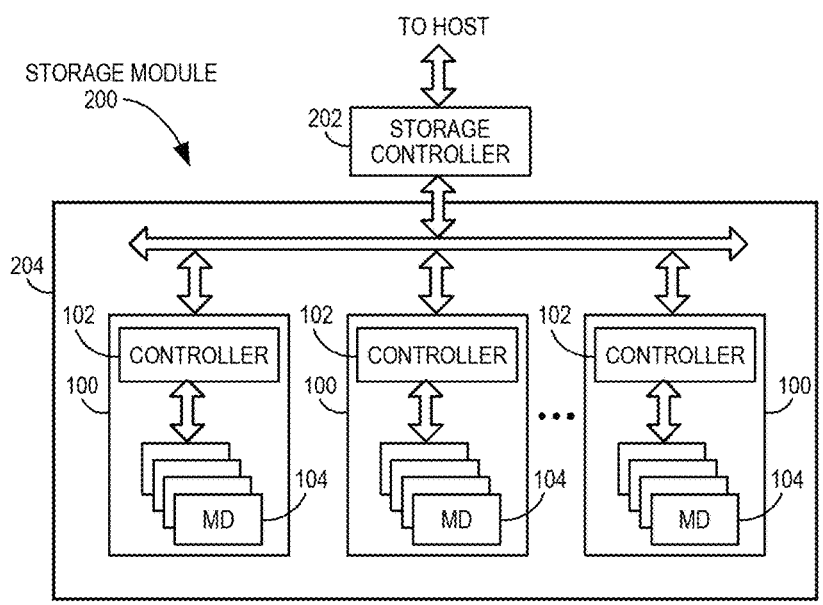
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
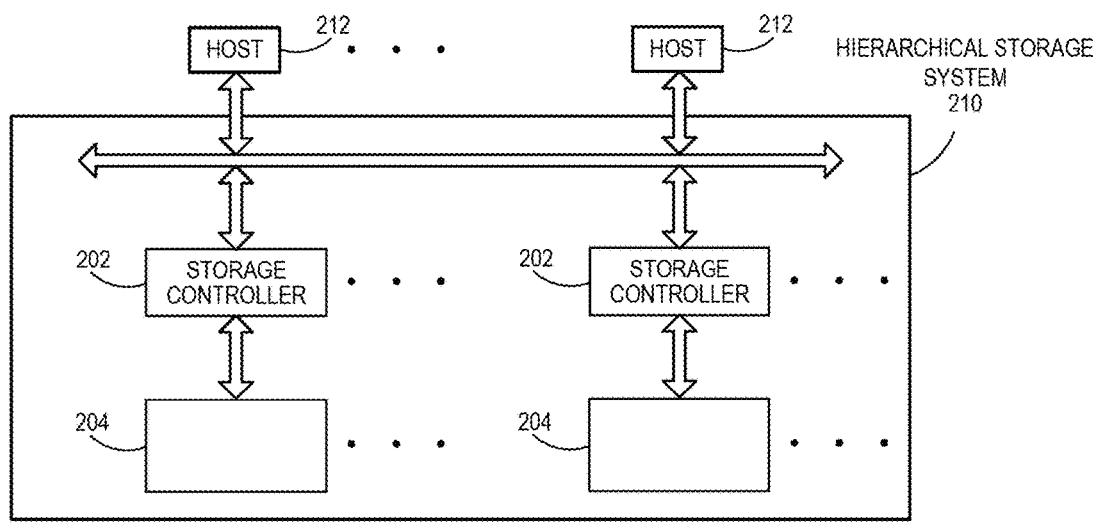
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
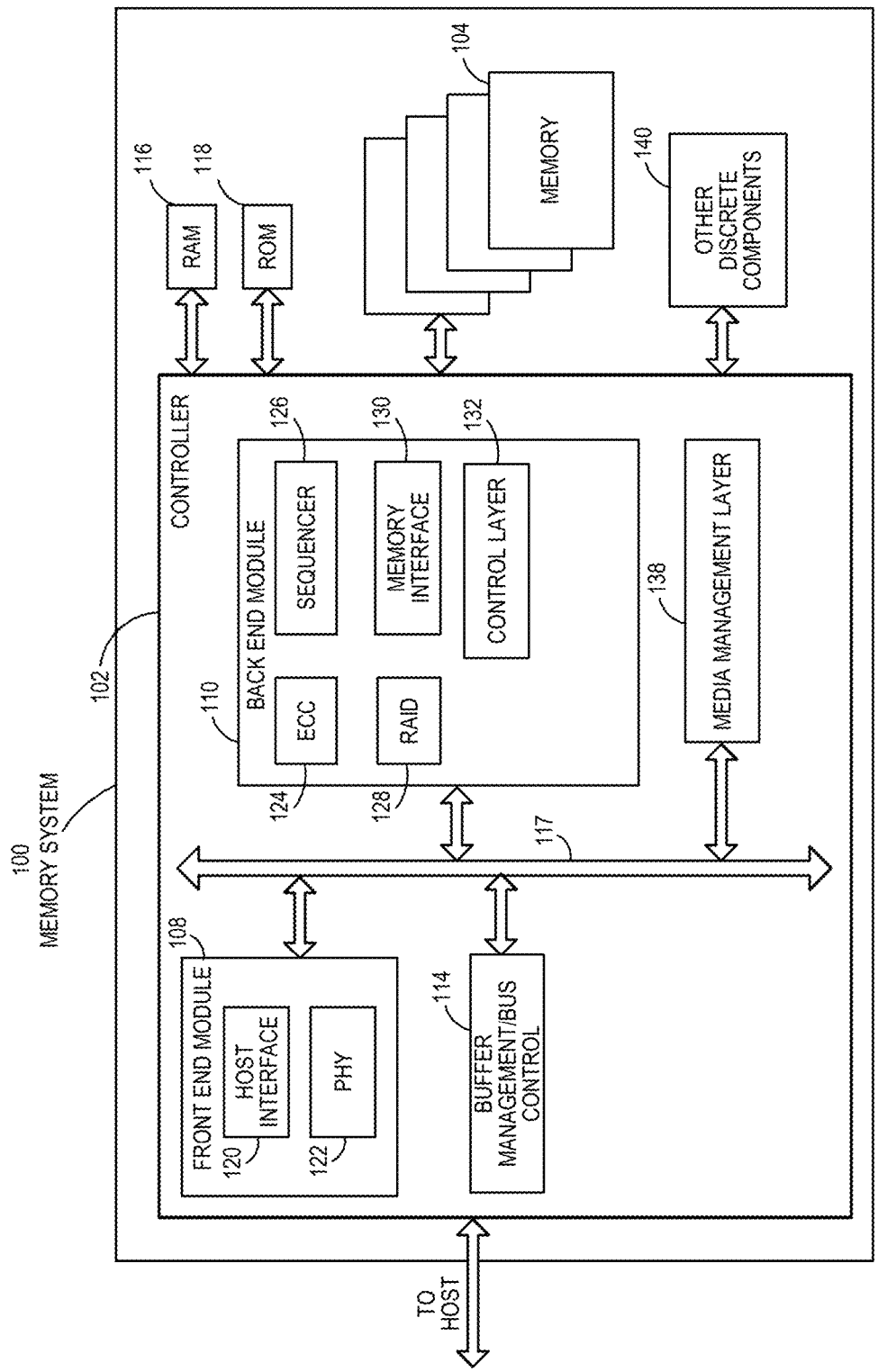
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/ bus controller 114 are optional components that may not be necessary in the controller 102.

Figure 2B:
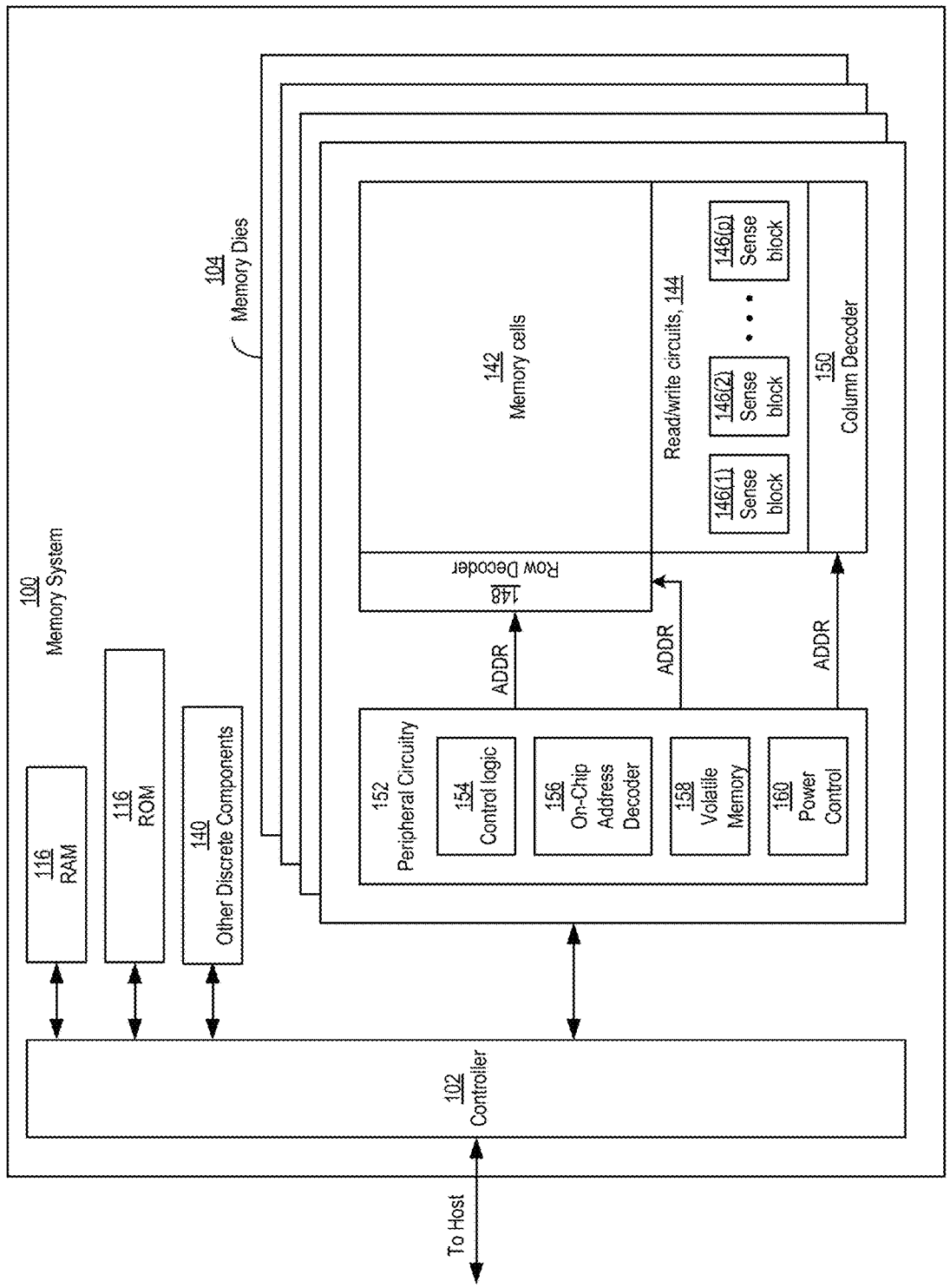
FIG. 2B is a block diagram of exemplary components of a non-volatile memory die of the non-volatile memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/ or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

For some memory configurations, such as flash memory, a memory cell of the plurality of memory cells 142 may be a floating gate transistor (FGT). FIG. 3 shows a circuit schematic diagram of an example FGT 300. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. For each given charge stored in the floating gate 308, a corresponding drain-to-source conduction current ID with respect to a fixed control gate Voltage $V_{CG}$ applied to the control gate 306 occurs. Additionally, the FGT 300 may have associated range charges that can be programmable onto its floating gate 308 that define a corresponding threshold voltage window or a corresponding conduction current window. In this way, the FGT's threshold voltage may be indicative of the data stored in the memory cell.

FIG. 4 is graph showing four curves 402, 404, 406, 408 of drain-to-source current ID drawn through the FGT 300 as a function of a control gate voltage $V_{CG}$ applied to the control gate 306. Each curve 402-408 corresponds to a respective one of four different charges or charge levels Q1, Q2, Q3, Q4 that the floating gate 308 can selectively store at any given time. Otherwise stated, the four curves 402-408 represent four possible charge levels that can be programmed on the floating gate 308 of the FGT 300, respectively corresponding to four possible memory states. In the example graph in FIG. 4, the threshold voltage window of a population of FGTs range from 0.5 volts (V) to 3.5 V. Seven possible memory states "0", "1", "2", "3", "4", "5", and "6"

are defined or extend across the threshold voltage window, and respectively represent one erased states and six programmed states. The different states can be demarcated by partitioning the threshold voltage window into six regions of 0.5 V intervals. The FGT 300 may be in one of the memory states according to the charge stored in its floating gate 308 and where its drain-to-source current ID intersects a reference current $I_{REF}$. For example, a FGT programmed to store charge Q1 in memory state "1" since its curve 402 intersects the reference current $I_{REF}$ in a region of the threshold voltage region demarcated by the control gate voltage $V_{CG}$ in a range from 0.5 V to 1.0 V. The more memory states the FGT 300 is programmed to store, the more finely divided are the regions defining the threshold voltage window. In some examples configurations, the threshold voltage window may extend from −1.5 V to 5 V, providing a maximum width of 6.5 V. If the FGT 300 can be programmed into any one of sixteen possible memory states, each memory state may occupy a respective region spanning 200 millivolts (mV) to 300 mV. The higher the resolution of the threshold voltage window (i.e., more memory states into which the FGT 300 can be programmed), the higher the precision that is needed in programming and reading operations to successfully read and write data. Further description of memory states and threshold voltages is provided in further detail below with respect to programming, program-verify, and read operations.

Referring to FIG. 5A, the memory cells 142 may be organized into an N-number of blocks, extending from a first block Block 1 to an Nth block Block N. Referring to FIG. 5B, for some example configurations, the N-number of blocks are organized into a plurality of planes. FIG. 5B shows an example configuration where the blocks are organized into two planes, including a first plane Plane 0 and a second plane Plane 1. Each plane is shown as included an M-number of blocks, extending from a first block Block 1 to an Mth block Block M. Data stored in different planes may be sensed simultaneously or independently.

For configurations where the memory cells are organized into a two-dimensional array, the memory cells may be configured in a matrix-like structure of rows and columns in each of the blocks. At the intersection of a row and a column is a memory cell. A column of memory cells is a referred to as a string, and memory cells in a string are electrically connected in series. A row of memory cells is referred to as a page. Where the memory cells are FGTs, control gates of FGTs in a page or row may be electrically connected together.

Additionally, each of the blocks includes word lines and bit lines connected to the memory cells. Each page of memory cells is coupled to a word line. Where the memory cells are FGTs, each word line may be coupled to the control gates of the FGTs in a page. In addition, each string of memory cells is coupled to a bit line. Further, a single string may span across multiple word lines, and the number of memory cells in a string may be equal to the number of pages in a block.

Figure 6:
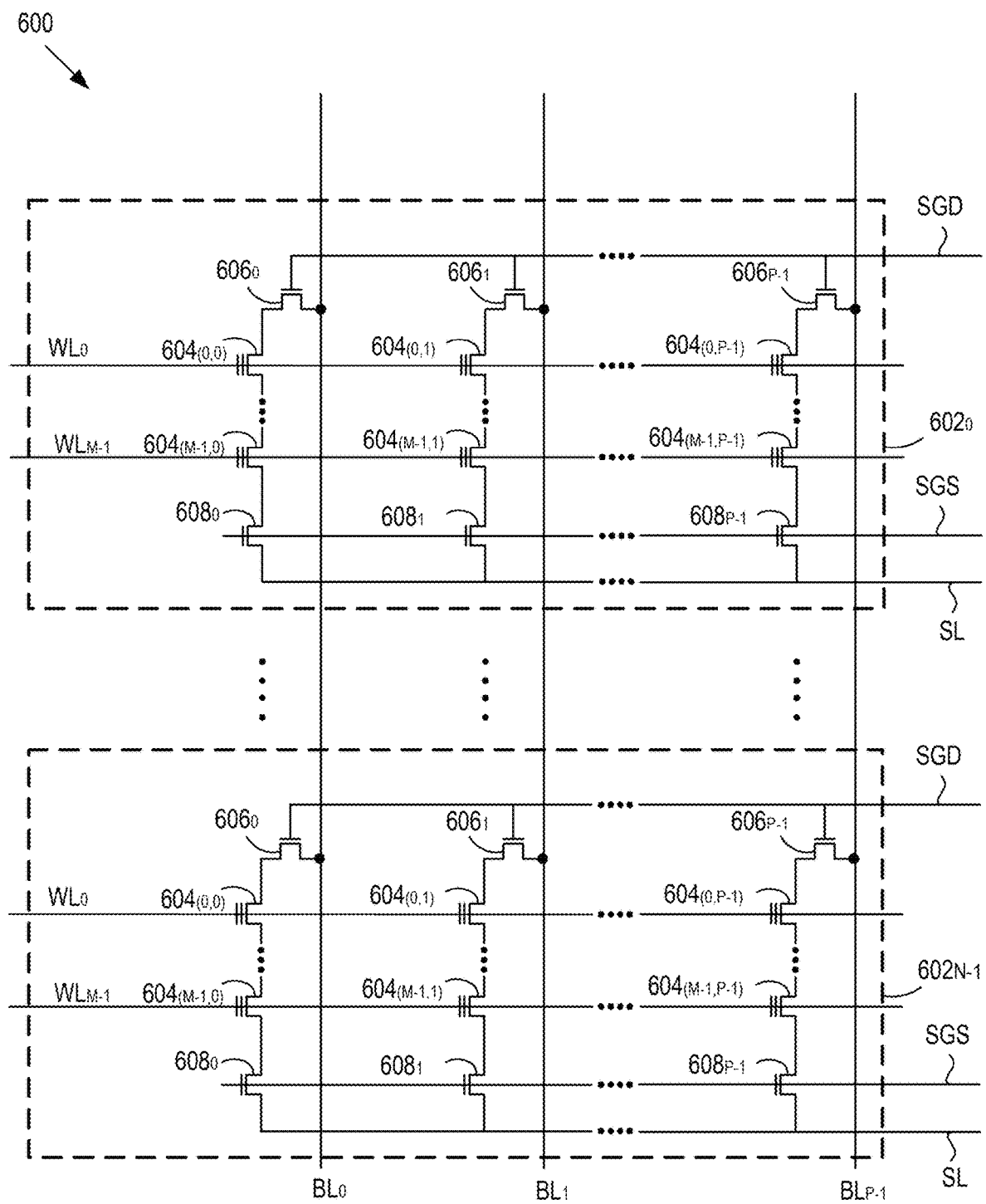
FIG. 6 is a circuit diagram of an example two-dimensional NAND-type flash memory array.

FIG. 6 is a circuit schematic diagram of at least a portion of an exemplary two-dimensional NAND-type flash memory array 600, which may be representative of at least a portion of the plurality of memory cells 142 (FIG. 2B). For example, the memory array 600 may be representative of a single plane of blocks on a memory die 104. The memory array 600 may include an N-number of blocks $602_0$ to $602_{N-1}$. Each block 602 includes a P-number of strings of FGTs 604, with each string coupled to respective one of a P-number of bit lines $BL_0$ to $BL_{P-1}$. Additionally, each block 602 includes an M-number of pages of FGTs 604, with each page coupled to a respective one of an M-number of word lines $WL_0$ to $WL_{M-1}$. Each ith, jth FGT(i,j) of a given block 602 is connected to an ith word line $WL_i$ and to a jth bit line $BL_j$ of the given block. As shown in FIG. 6, bit lines $BL_0$ to $BL_{P-1}$ are shared among the blocks $602_0$ to $602_{N-1}$ may be which are shared among the blocks, such as blocks within the same plane.

Within each block 602, each string is connected at one end to an associated drain select gate transistor 606, and each string is coupled to its associated bit line BL via the associated drain select gate transistor 606. Switching of the drain select gate transistors $606_0$ to $606_{P-1}$ may be controlled using a drain select gate bias line SGD that supplies a drain select gate bias voltage $V_{SGD}$ to turn on and off the drain select transistors $606_0$ to $606_{P-1}$. In addition, within each block 602, each string is connected at its other end to an associated source select gate transistor 608, and each string is coupled to a common source line SL via the associated source select gate transistor 608. Switching of the source select gate transistors $608_0$ to $608_{P-1}$ may be controlled using a source select gate bias line SGS that supplies a source select gate bias voltage $V_{SGS}$ to turn on and off the source select transistors $608_0$ to $608_{P-1}$. Also, although not shown, in some cases, dummy word lines, which contain no user data, can also be used in the memory array 600 adjacent to the source select gate transistors $608_0$ to $608_{P-1}$. The dummy word lines may be used to shield edge word lines and FGTs from certain edge effects.

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 7:
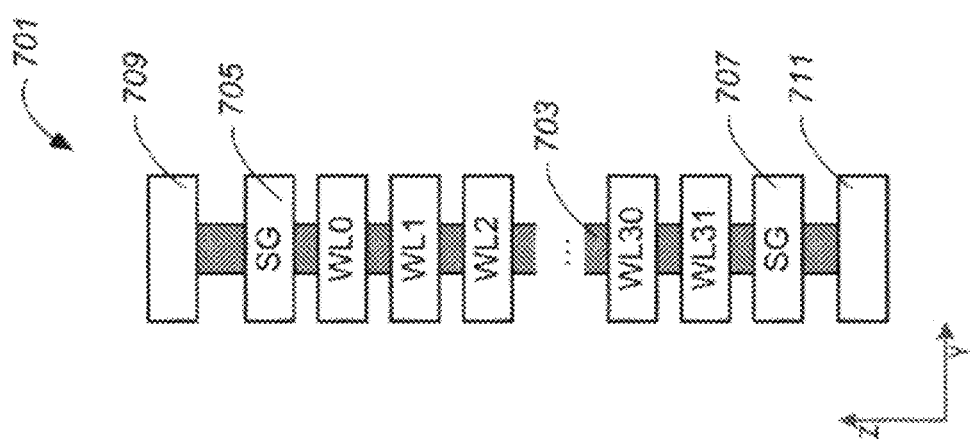
FIG. 7 is an example physical structure of a three-dimensional (3-D) NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with two-dimensional (planar) NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8A:
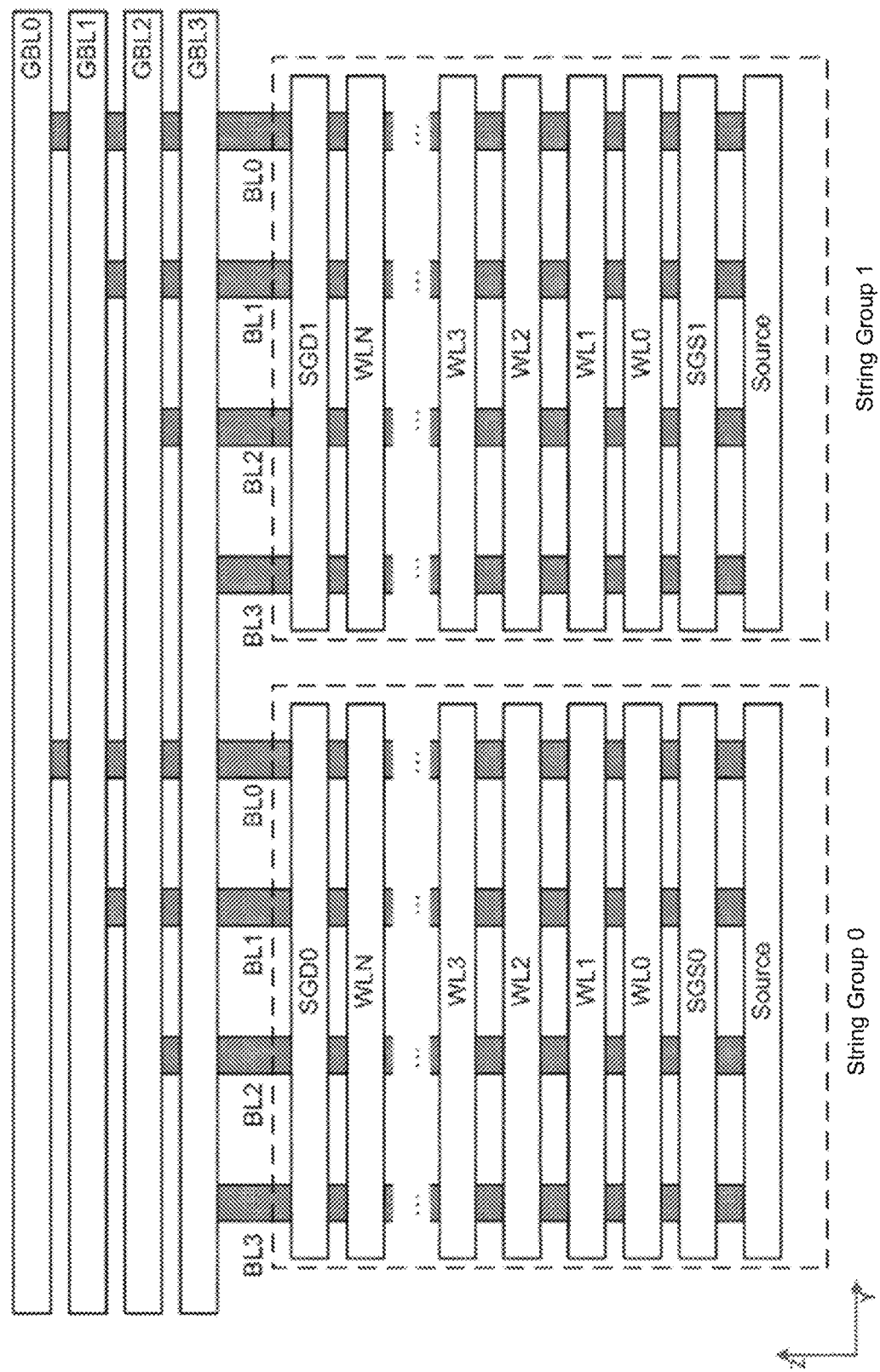
FIG. 8A is a cross-sectional view along the bit line direction (along the y-direction) of an example memory structure in which straight vertical NAND strings extend from common source connections in or near a substrate to global bit lines that extend over physical levels of memory cells.

FIG. 8A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 8A shows only portions of GBL0-GBL3, and that these bit lines extend further in the y-direction and may connect with additional NAND strings in the block and in other blocks. Furthermore, additional bit lines extend parallel to GBL0-GBL3 (e.g. at different locations along x-axis, in front of, or behind the location of the cross-section of FIG. 8A).

Figure 8B:
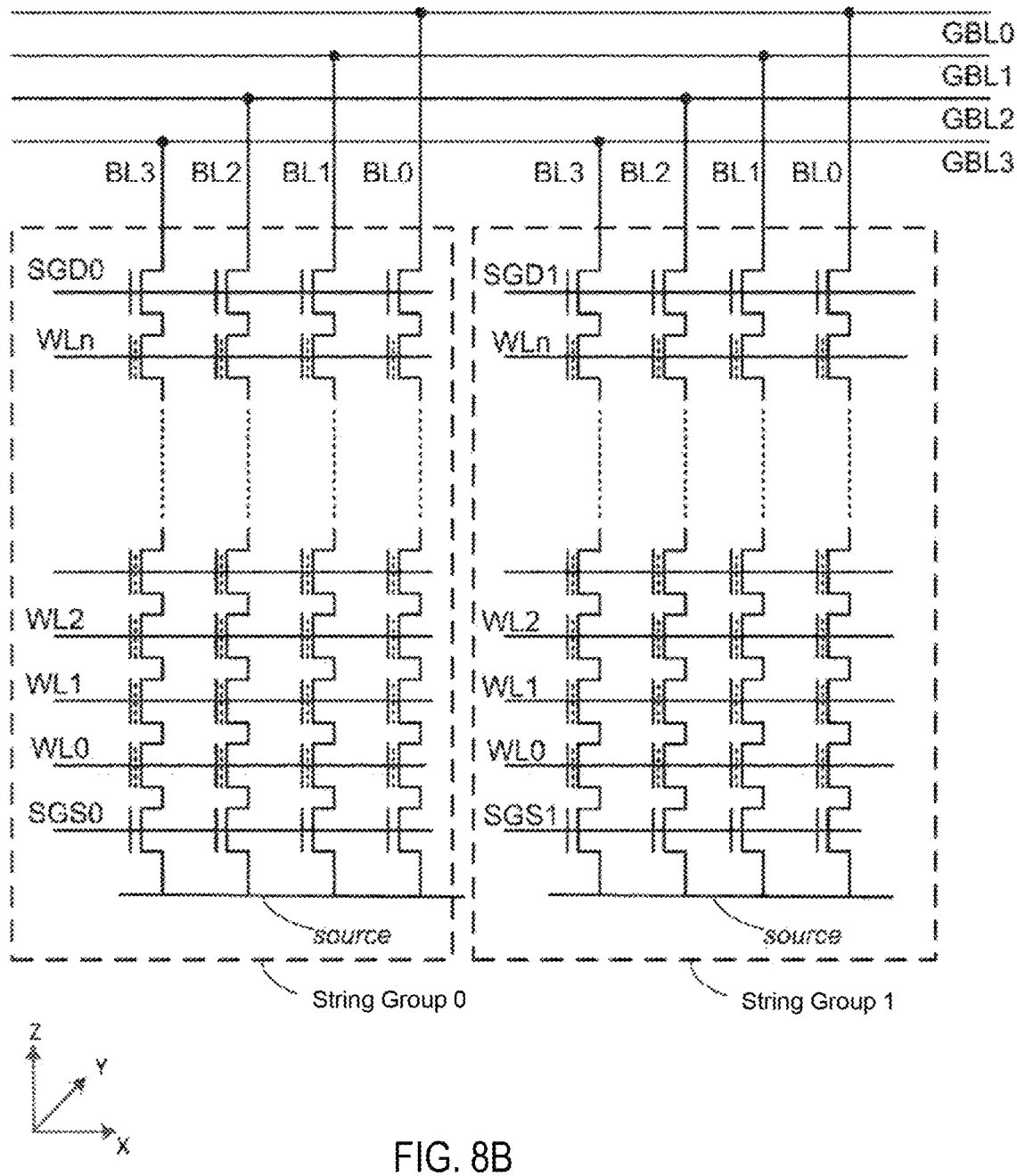
FIG. 8B is a circuit diagram of separately-selectable sets of NAND strings of FIG. 8A.

FIG. 8B illustrates separately-selectable sets of NAND strings of FIG. 8A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 8C:
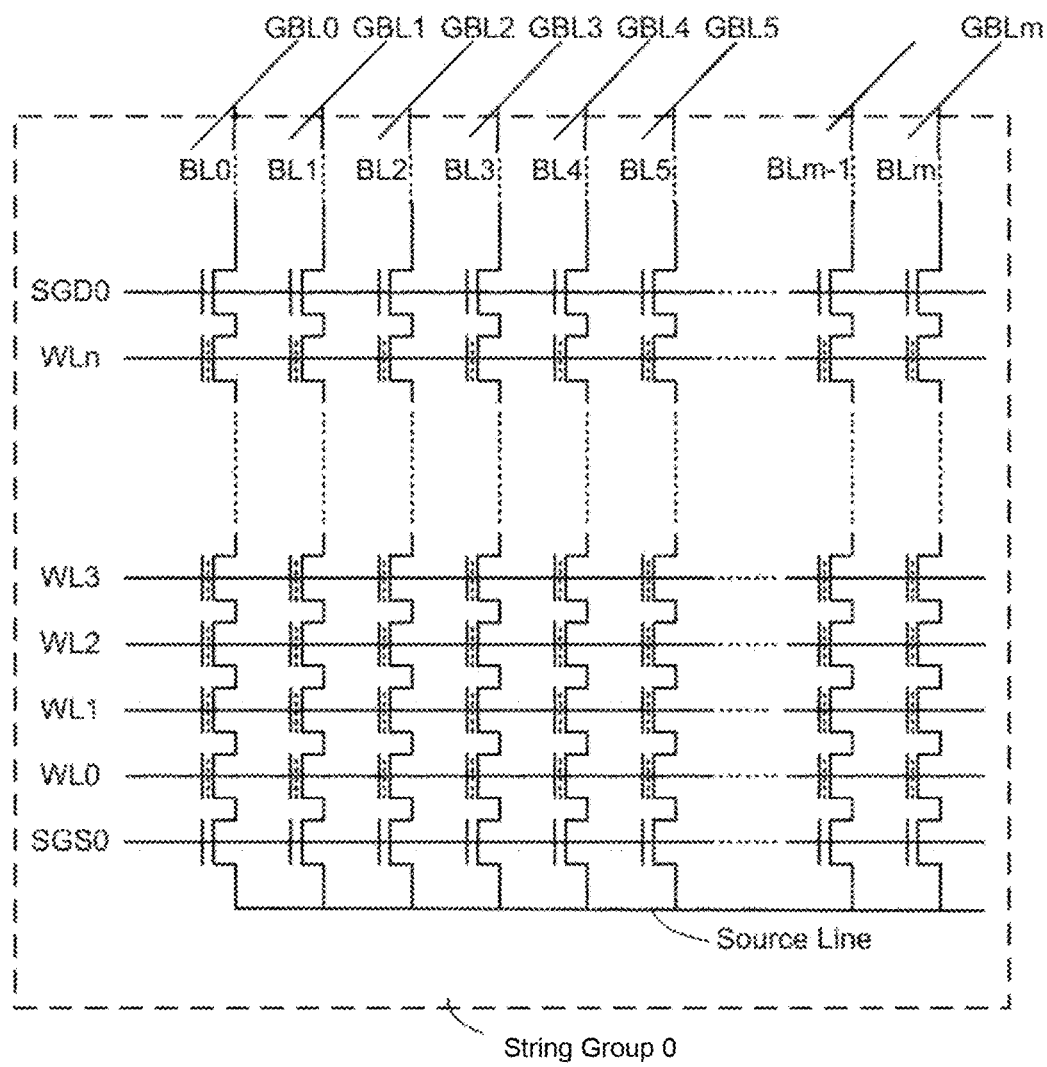
FIG. 8C is a circuit diagram of a separately selectable set of NAND strings in cross section along the x-z plane.

FIG. 8C shows a separately selectable set of NAND strings, String 0, of FIGS. 8A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming a page of memory cells in parallel.

The memory die 104 may also include a row address decoder 148 and a column address decoder 150. The row address decoder 148 may decode a row address and select a particular word line in the memory array 142 when reading or writing data to/from the memory cells 142. The column address decoder 150 may decode a column address to select a particular group of bit lines in the memory array 142 to read/write circuits 144.

In addition, the non-volatile memory die 104 may include peripheral circuitry 152. The peripheral circuitry 152 may include control logic circuitry 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including voltages (including program voltage pulses) to the word lines, erase voltages (including erase voltage pulses), the source select gate bias voltage $V_{SSG}$ to the source select gate bias line SSG, the drain select gate bias voltage $V_{DSG}$ to the drain select gate bias line DSG, a cell source voltage $V_{celsrc}$ on the source lines SL, as well as other voltages that may be supplied to the memory array 142, the read/write circuits 144, including the sense blocks 146, and/or other circuit components on the memory die 104. The various voltages that are supplied by the power control circuitry 160 are described in further detail below. The power control circuitry 160 may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations.

In order to program a target memory cell, and in particular a FGT, the power control circuitry 160 applies a program voltage to the control gate of the memory cell, and the bit line that is connected to the target memory cell is grounded, which in turn causes electrons from the channel to be injected into the floating gate. During a program operation, the bit line that is connected to the target memory cell is referred to as a selected bit line. Conversely, a bit line that is not connected to a target memory cell during a program operation is referred to as an unselected bit line. In this context, a state of the bit line may refer to whether the bit line is selected or unselected. Otherwise stated, a bit line can be in one of two states, selected or unselected. When electrons accumulate in the floating gate, the floating gate becomes negatively charged and the threshold voltage $V_{TH}$ of the memory cell is raised. The power control circuitry 160 applies the program voltage $V_{PGM}$ on the word line that is connected to the target memory cell in order for the control gate of the target memory cell to receive the program voltage $V_{PGM}$ and for the memory cell to be programmed. As previously described, in a block, one memory cell in each of the NAND strings share the same word line. During a program operation, the word line that is connected to a target memory cell is referred to as a selected word line. Conversely, a word line that is not connected to a target memory cell during a program operation is referred to as an unselected word line.

FIGS. 9A-9C are plots of threshold voltage distribution curves for different numbers of bits being stored the memory cells. The threshold voltage distribution curves are plotted for threshold voltage $V_{TH}$ as a function of the number of memory cells. FIG. 9A show threshold voltage distribution curves for memory cells programmed to store two bits of data, FIG. 9B show threshold voltage distribution curves for memory cells programmed to store three bits of data, and FIG. 9C show voltage distribution curves for memory cells programmed to store four bits of data. Similar threshold voltage distribution curves may be generated for memory cells programmed to store numbers of bits other than two, three, and four.

At a given point in time, each memory cell may be a particular one of a plurality of memory states (otherwise referred to as a data state). The memory states may include an erased stated and a plurality of programmed states. Accordingly, at a given point in time, each memory cell may be in the erased state or one of the plurality of programmed states. The number of programmed states corresponds to the number of bits the memory cells are programmed to store. With reference to FIG. 9A, for a memory cell programmed to store two bits, the memory cell may be in an erased state Er or one of three programmed states A, B, C. With reference to FIG. 9B, for a memory cell programmed to store three bits, the memory cell may be in an erased state Er or one of seven programmed states A, B, C, D, E, F, G. With reference to FIG. 9C, for a memory cell programmed to store four bits, the memory cell may be in an erased state Er or one of fifteen programmed states 1, 2, 3, 4, 5, 6, 7, 8, 9, A, B, C, D, E, F. As shown in FIGS. 9A-9C, each voltage distribution curve is associated with the erased state or one of the programmed states.

Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage $V_{TH}$ a memory cell has allows the data (i.e., the logic values of the bits) that the memory cell is storing to be determined. The specific relationship between the data programmed into the memory cells and the threshold voltage levels of the memory cell depends on the data encoding scheme used for programming the memory cells. In one example, as shown in FIGS. 9A and 9B, a Gray code scheme is used to assign data values to the threshold voltage distribution curves. Under this scheme, for memory cells programmed with two bits of data, the data value "11" is assigned to the range of threshold voltages associated with the erased state Er, the data value "01" is assigned to the range of threshold voltages associated with programmed state A, the data value "00" is assigned to the range of threshold voltages associated with programmed state B, and the data value "10" is assigned to the range of threshold voltages associated with the programmed state C. Similar relationships between data values and memory states can be made for memory cells programmed to store three bits, four bits, or other bits of data.

Prior to performance of a program operation that programs a plurality or group of target memory cells, all of the memory cells of the group subjected to and/or selected to be programmed in the program operation may be in the erased state. During the program operation, the power control circuitry 160 may apply the program voltage to a selected word line and in turn the control gates of the target memory cells as a series of program voltage pulses. The target memory cells being programmed concurrently are connected to the same, selected word line. In many program operations, the power control circuitry 160 increases the magnitude of the program pulses with each successive pulse by a predetermined step size. Also, as described in further detail below, the power control circuitry 160 may apply one or more verify pulses to the control gate of the target memory cell in between program pulses as part of a program loop or a program-verify operation. Additionally, during a program operation, the power control circuitry 160 may apply one or more boosting voltages to the unselected word lines.

The target memory cells connected to the selected word line will concurrently have their threshold voltage change, unless they have been locked out from programming. When the program operation is complete for one of the target memory cells, the target memory cell is locked out from further programming while the program operation continues for the other target memory cells in subsequent program loops. As described in greater detail below, the locking out of a target memory cell that has reached its desired memory state may be accomplished in different ways. For example, a bit line may be locked out via the control logic circuitry by applying an inhibit voltage to the bit line on which the target cell resides to prevent a current flow through the target cell that would disturb the current memory state when a next programming pulse on the word line for the target memory cell is received. Also, for some example program operations, the control logic circuitry 154 may maintain a counter that counts the program pulses.

During a program operation to program a group of target memory cells, each target memory cell is assigned to one of the plurality of memory states according to write data that is to be programmed into the target memory cells during the program operation. Based on its assigned memory state, a given target memory cell will either remain the erased state or be programmed to a programmed state different from the erased state. When the control logic 154 receives a program command from the controller 102, or otherwise determines to perform a program operation, the write data is stored in latches included in the read/write circuitry 144. During the program operation, the read/write circuitry 144 can read the write data to determine the respective memory state to which each of the target memory cells is to be programmed.

As described in further detail below, and as illustrated in FIGS. 9A-9C, each programmed state is associated with a respective verify voltage level $V_V$. A given target memory cell is programmed in its assigned memory state when its threshold voltage $V_{TH}$ is above the verify voltage $V_V$ associated with the memory state assigned to that target memory cell. As long as the threshold voltage $V_{TH}$ of the given target memory cell is below the associated verify voltage $V_V$, the control gate of the target memory cell may be subject to a program pulse to increase the target memory cell's threshold voltage $V_{TH}$ to within the threshold voltage range associated with the memory state assigned to the given target memory cell. Alternatively, when the threshold voltage $V_{TH}$ of the given target memory cell increases to above the associated verify voltage level $V_V$, then programming may be complete for the given target memory cell. As described in further detail below, a sense block 146 may participate in a program-verify operation that determines whether programming for a given memory cell is complete.

In general, in a program operation, the power control circuitry 160 will apply multiple or several program pulses to the selected word line in order to program all of the target memory cells into their assigned memory states. The application of the multiple program pulses applied to the selected memory cell during a program operation is divided into multiple program stages. During each program stage, the power control circuitry 160 applies at least one of the program pulse of the plurality of pulses on the selected word line in order to increase the threshold voltages $V_{TH}$ of those target memory cells that are selected or not locked out at that point in time of the program operation.

As previously mentioned, target memory cells subject to a program operation may also be subject to a verify operation that determines when programming is complete for each of the target memory cells. The verify operation is divided into a plurality of verify stages. A verify stage is a sub-operation of a program operation (also known as a program-verify operation) during which circuitry performs a sense operation on a subset of memory cells assigned to the same memory state to determine which of the memory cells of the subset are sufficiently programed into the assigned memory state. Each verify stage is associated with one of a plurality of different memory states into which different target memory cells are to be programmed in a program operation. Each verify stage is performed to verify whether those target memory cells assigned to be programmed in the associated memory state are programmed in the associated memory state. As described in further detail below, in a given verify stage, a sense operation is performed on selected memory cells of a plurality of target memory cells while the power control circuitry 160 applies one or more verify pulses on the selected word line in order to verify whether the selected memory cells are programmed to an assigned memory state. To do so, a sense operation performed in a verify stage determines whether the selected memory cells' threshold voltages have increased to above the verify voltage level $V_V$ associated with the memory state and the verify stage. Those target memory cells assigned to memory states different than the associated memory state are not verified during the given verify stage.

Herein, a program-verify operation is an operation performed by circuitry on a memory die during which the circuitry applies a program pulse on a word line and then verifies which of a plurality of memory cells coupled to the word line are programmed in their assigned memory states in response to the program pulse. A program-verify operation includes a combination of a program stage and at least one verify stage that follows the program stage. Additionally, in at least some example configurations, the program-verify operation may include a pre-charge stage at the beginning of the program-verify operation (i.e., before the program stage begins).

Herein, a pre-charge stage is a stage of a program-verify operation that occurs before the program stage. During the pre-charge stage, bit line biasing circuitry selectively biases bit lines to cause memory cells connected to the bit lines and the selected word line that are not yet programmed into their assigned memory states to increase their threshold voltages in response to a program pulse provided in the program stage. Furthermore, during the pre-charge stage, the bit line biasing circuitry may selectively bias, or otherwise control, the voltage or current levels of bit lines connected to other memory cells that are programmed into their assigned memory states such that the memory cells are inhibited from changing their threshold voltages in response to a subsequent program pulse.

A program-verify operation may also include a discharge stage at the end of the program-verify operation (i.e., after a last verify stage of the program-verify operation), during the discharge stage the bit line voltage is discharged down to the initial voltage level (e.g., the cell source voltage level Vcelsrc). Accordingly, an example program-verify operation includes, in sequential order, a pre-charge stage, a program stage, one or more verify stages, and a discharge stage. As each program stage is generally intended to avoid overshooting a desired programming state by injecting small amounts of charge into the cell being programmed followed by one or more verify stages measuring what the resulting programming state is, the program-verify operation may be repeated until the target memory cells have been programmed to respective desired memory states. Otherwise stated, a single program operation to program target memory cells coupled to a selected word line into assigned memory states may include multiple program-verify operations, with each program-verify operation including a program stage followed by one or more verify stages. In this context, within a program operation, one or more verify stages are performed in between consecutive program stages. An example program-verify operation that includes a program stage followed by one or more verify stages is described in further detail below.

In addition, a program stage of a program-verify operation includes the power control circuitry 160 supplying one or more program pulses to the selected word line for that program stage, and a single verify stage of a program-verify operation includes the power control circuitry 160 supplying one or more verify pulses to the selected word line for that single program stage. Accordingly, a program-verify operation may include the power control circuitry 160 supplying a pulse train or a series of voltage pulses to the selected word line, where the pulse train includes one or more program pulses followed by one or more verify pulses. After a last verify pulse of the program-verify operation, the power control circuitry 160 may transition into a next program-verify operation by supplying one or more program pulses, followed by one or more verify pulses. The power control circuitry 160 may proceed in this manner until the program operation concludes. Accordingly, a program operation is complete or concludes when the verify operation portion of the program operation identifies that all of the target memory cells coupled to the selected word line have been programmed to their assigned threshold voltages $V_{TH}$. As mentioned, the verification operation portion of the program operation verifies or determines that a given target memory cell is finished being programmed when a given verify stage determines that the target memory cell's threshold voltage $V_{TH}$ has increased to above the verify voltage level $V_V$ associated with the memory state to which the target cell is to be programmed.

For some example program-verify operations, all of the target memory cells subject to a program operation are not subject to the same verify stage at the same time. Alternatively, for a single verify stage, only those target memory cells that are assigned to the same memory state are subject to a verify stage. For a single verify stage, target memory cells that are subject to the single verify stage are called selected memory cells or selected target memory cells, and target memory cells that are not subject to the single verify stage are called unselected memory cells or unselected target memory cells. Likewise, for a group of bit lines connected to the target memory cells of a program-verify operation, bit lines connected to the selected memory cells for a single verify stage are called selected bit lines, and bit lines connected to the unselected memory cells for a single verify stage are called unselected bit lines. In this context, a state of the bit line may refer to whether the bit line is selected or unselected. Otherwise stated, a bit line connected to a target memory cell can be in one of two states, selected or unselected.

For each of the verify stages, the power control circuitry 160, or some combination of the power control circuitry 160, the read/write circuitry 144, and the sense blocks 146, may supply voltages at appropriate levels to the selected and unselected word lines and the selected and unselected bit lines in order for a verify stage to be performed for the selected memory cells of the target memory cells subject to the program-verify operation. For clarity, and unless otherwise specified, the combination of the power control circuitry 160, the read/write circuitry 144, and the sense blocks 146 used to bias the selected and unselected word lines and bit lines at appropriate levels during a given memory operation (e.g., a program operation, a verify operation, a program-verify operation, a read operation, a sense operation, or an erase operation) is herein referred to collectively as voltage supply circuitry. Voltage supply circuitry may refer to the power control circuitry 160, the sense block circuitry 146, other circuit components of the read/write circuitry 144, or any combination thereof.

For performance of a verify stage in a block, the voltage supply circuitry may supply a drain select gate bias voltage $V_{SGD}$ on the drain select gate bias line SGD to the control gates of the drain select gate transistors (such as those shown in FIGS. 6-19C) and a source select gate bias voltage $V_{SGS}$ on the source select gate bias line SGS to the control gates of the drain select gate transistors (such as those shown in FIGS. 6-9C) at levels that turn on the drain select gate transistors and the source select gate transistors in response to the voltage supply circuitry supplying voltages at suitable levels on the common source line SL and to the bit lines.

Additionally, the voltage supply circuitry supplies a source line voltage at a cell source voltage level Vcelsrc, otherwise referred to as the cell source voltage Vcelsrc, on the common source line SL. Further, the voltage supply circuitry biases the drain side of the selected bit lines with a high supply voltage VBLC that is higher in magnitude than the cell source voltage Vcelsrc. The difference between the high supply voltage VBLC and the cell source voltage level Vcelsrc may be great enough to allow current to flow from the drain side to the source side of a string that includes a selected target memory cell in the event that the selected target memory cell has a threshold voltage $V_{TH}$ that allows it to conduct a current. During a verify stage, a selected memory cell can be generally characterized as fully conducting, marginally conducting, or non-conducting, depending on the threshold voltage $V_{TH}$ of the selected memory cell. Also, the voltage supply circuitry biases the drain side of the unselected bit lines to the cell source voltage Vcelsrc. By biasing the drain side and the source side of unselected bit lines to the cell source voltage Vcelsrc, the voltage difference between the drain side and source side voltages will not allow current to flow through the NAND string connected to the unselected bit line. Further, the voltage supply circuitry biases the unselected word lines, and in turn the control gates of FGTs coupled to the unselected word lines, to a read voltage Vread. The read voltage is high enough to cause the FGTs coupled to unselected word lines to conduct a current regardless of its threshold voltage $V_{TH}$. In addition, the voltage supply circuitry biases the selected word line with a control gate reference voltage $V_{CGRV}$, which may be in the form of one or more verify pulses as previously described. The control gate reference voltage $V_{CGRV}$ may be different for verification of target memory cells of different memory states. For example, the voltage supply circuitry may supply a different control gate reference voltage $V_{CGRV}$ (or a control gate reference voltage $V_{CGRV}$ at different level) when verifying target memory cells programmed to state A than when verifying target memory cells programmed to state B, and so on.

Once the voltage supply circuitry supplies the voltages to the selected and unselected word lines and bit lines, and to the drain select gate transistors, source select gate transistors, drain select gate bias line SGD, and source select gate bias line SGS, a sense block can perform a sense operation that identifies whether a selected target memory cell is conducting, and in turn sufficiently programmed. Further details of a sense operation performed during an associated verify stage are described in further detail below.

A read operation is an operation that identifies the memory states of target memory cells of a page coupled to a selected word line. As previously described, the threshold voltage $V_{TH}$ of a memory cell may identify the data value of the data it is storing. Accordingly, in order to determine the memory stages, the read operation determines whether the target memory cells conduct at a specific threshold voltages $V_{TH}$ applied to the selected word line. To determine the memory states during a read operation, the sense blocks 146 may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage $V_{TH}$ of the target memory cells. The level of the voltage supplied to the selected word lines may vary depending on the memory states of the target memory cells.

The voltage supply circuitry may also bias the bit lines so that the high supply voltage VBLC is applied to the drain side of the bit lines and the cell source voltage Vcelsrc is applied to the source side of the bit lines to allow for the current flow, provided that the threshold voltage $V_{TH}$ of the selected memory cell allows for it. For some example read configurations, the sense block 146 can perform a sense operation for fewer than all of the memory cells of a page. For such configurations, the target memory cells of the page that are subject to and/or that are selected for a given sense operation are referred to as selected memory cells or selected target memory cells. Conversely, the target memory cells of the page that are not subject to and/or that are not selected for the sense operation are referred to as unselected memory cells. Accordingly, bit lines connected to selected target memory cells are referred to as selected bit lines, and bit lines connected to unselected target memory cells are referred to as unselected bit lines. In this context, a state of the bit line may refer to whether the bit line is selected or unselected. Otherwise stated, a bit line can be in one of two states, selected or unselected. The voltage supply circuitry can supply the voltages to the selected and unselected word lines and the selected and unselected bit lines at levels in various combinations, in various sequences, and/or over various sense operations in order determine the threshold voltages of the target memory cells so that the data values of the data that the target memory cells are storing can be determined.

In addition, as described in further detail below, a read operation to read data from a plurality of target memory cells coupled to a selected word line may include a plurality of stages, including one or more read stages and a discharge stage at the end of a last read stage. A read stage is a stage of a read operation that identifies which of the target memory cells coupled to the selected word line are programmed in a memory state associated with the read stage. Circuitry involved in the read operation performs a sense operation in each of the read stages to determine the memory states, and in turn the logic or data values of the plurality of target memory cells. As the target memory cells may be programmed in different memory states, each read stage is associated with a different one of the memory states in which the target memory cells may be programmed. During a read operation, a given read stage is performed to determine which of the target memory cells are programmed in the memory state associated with the given read stage.

Figure 10:
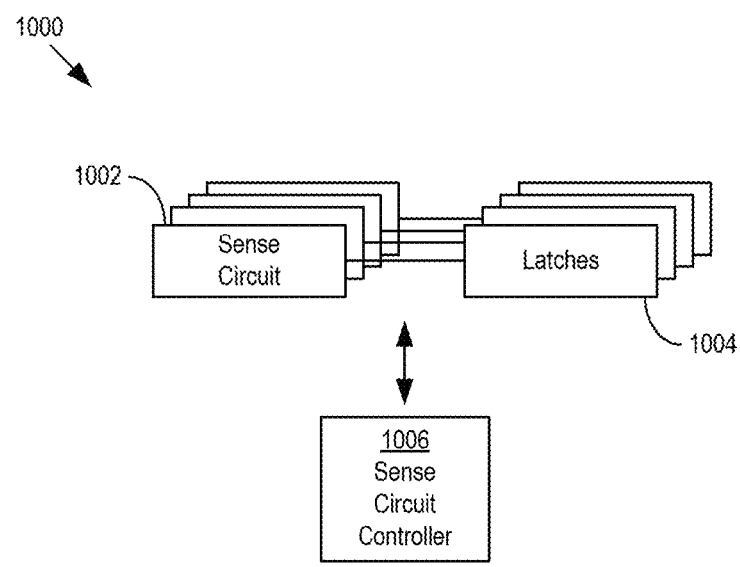
FIG. 10 is a block diagram of an example configuration of a sense block of FIG. 2B.

FIG. 10 is a block diagram of an example configuration of a sense block 1000 configured to perform a sense operation. The sense block 1000 may be representative of one of the sense blocks 146(1) to 146(p) of FIG. 2B. The sense block 1000 may include a plurality of sense circuits 1002 and a plurality of sets of latches 1004. Each sense circuit (also referred to as a sense amplifier circuit) 1002 may be associated with a respective one of the latches 1004. That is, each sense circuit 1002 may be configured to communicate with and/or perform a sense operation using data and/or storing data into its associated latches set 1004. Additionally, the sense block 1000 may include a sense circuit controller 1006 that is configured to control operation of the sense circuits 1002 and the sets of latches 1004 of the sense block 1000. As described in further detail below, the sense circuit controller 106 may control operation of the sense circuits 1002 and the latches 1004 by outputting control signals to terminals of the sense circuits 1002 and the latches 1004. Additionally, the sense circuit controller 1006 may communicate with and/or may be a part of the control logic 154. The sense circuit controller 1006 may be implemented in hardware, or a combination of hardware and software. For example, the sense circuit controller 1006 may include a processor that executes computer instructions stored in memory to perform at least some of its functions.

Figure 11:
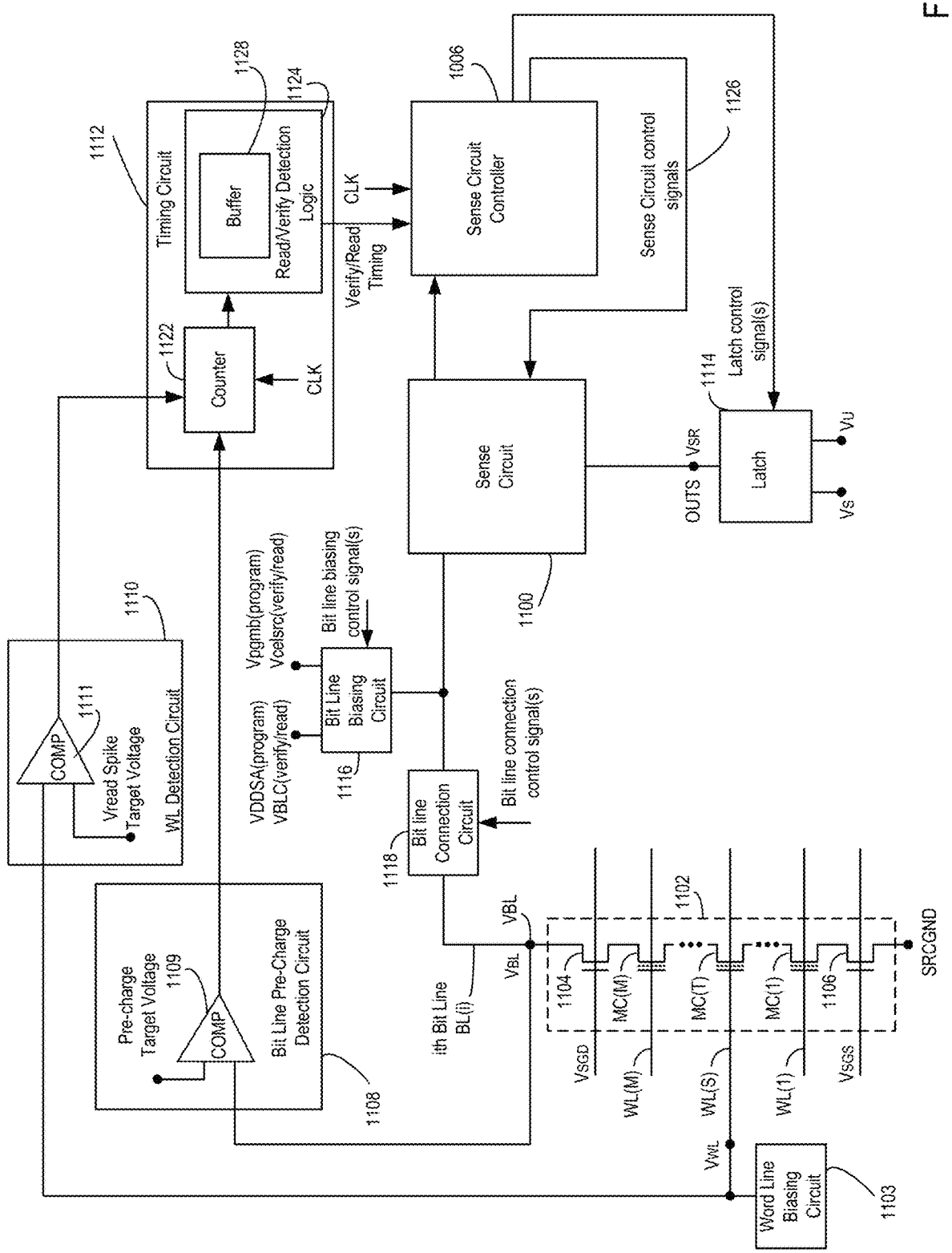
FIG. 11 is a block diagram of an example configuration of a system configured to set time periods in read and verify stages.

FIG. 11 is a block diagram of an example system configured to set time periods for performance of sense operations and to perform sense operations according to the set time periods during verify stages of program-verify operations and read stages of read operations. Before describing the circuit components used to set the time periods, circuitry of the system used to perform a sense operation is described.

The circuitry used to perform a sense operation includes an example sense circuit 1100 that may be representative of one of the sense circuits 1002 of the sense block 1000 of FIG. 10, and/or included in one of the sense blocks 146 of FIG. 2B. In addition, the sense circuit 1100 is coupled to, and configured to sense current drawn through, an associated ith bit line BL(i).

In FIG. 11, the ith bit line BL(i) is connected to an associated NAND string 1102. The ith bit line BL(i) may be one of a plurality bit lines and the NAND string 1102 may be one of a plurality of NAND strings included in a memory cell structure 142 of one of the memory dies 104. The NAND string 1102 includes an M-number of memory cells MC(1) to MC(M). For purposes of illustration, one of the memory cells MC(1) to MC(M) is identified as being a target memory cell MC(T). For a read operation, the target memory cell MC(T) is a memory cell from which data is to be read and thus, for which a sense operation is performed. For a program-verify operation, the target memory cell MC(T) is a memory cell being programmed. FIG. 11 shows the target memory cell MC(T) connected to a selected word line WL(S). FIG. 11 also shows a word line biasing circuit 1103 coupled to the selected word line WL(S) and configured to bias the selected word line WL(S) with a word line voltage $V_{WL}$ and/or generate the word line voltage $V_{WL}$ on the selected word line WL(S). Operation of the word line biasing circuit 1103 is described in further detail below. FIG. 11 also shows the NAND string 1102 including, on its drain side, a drain select gate transistor 1104 configured to receive a drain select gate voltage $V_{SGD}$ at its control gate, and including, on its source side, a source select gate transistor 1106 configured to receive a source select gate voltage $V_{SGS}$ at its control gate. FIG. 11 also shows the ith bit line BL(i) and associated NAND string 1102 connected to a bit line bias node $V_{BL}$ on its drain side, where the ith bit line is configured to be biased with a bit line bias voltage $V_{BL}$. In addition, the ith bit line BL(i) is connected to a source ground node SRCGND, which is connected to an associated source line SL. As described in further detail below, the source ground node SRCGND may be biased with the cell source voltage Vcelsrc.

In addition, the sense circuit 1100 is connected to and/or in communication with a latch 1114, which, for at least some example configurations, may be representative of a plurality or collection of latches that the sense circuit 1100 communicates with to perform sense operations. For example, other latches may include data latches configured to store data that is to be programmed into the target memory cell MC(T) or data that is sensed from the target memory cell MC(T). For clarity, the sense circuit 1100, the ith bit line BL(i), the NAND string 1102 connected to the ith bit line BL(i), and the latch 1114 are be referred to as all being associated with each other. Accordingly, reference to the latch 1114 being associated with the ith bit line BL(i) means that the latch 1114 is connected to the same sense circuit 1100 as the ith bit line BL(i)

The latch 1114 may be configured to generate and output a select voltage $V_S$ and an unselect voltage $V_U$. The sense circuit controller 1006 may be configured to control the latch 1114 to perform a latch write operation in a write mode to set the voltage levels of the select and unselect voltages $V_S$, $V_U$ at the start of a sense operation. In particular, the sense circuit controller 1006 may be configured to output the latch control signals to cause the latch 1114 to generate and output the select voltage $V_S$ at its high voltage level and the unselect voltage $V_U$ at its low voltage level, or to generate and output the select voltage $V_S$ at its low voltage level and the unselect voltage $V_U$ at its high voltage level for the sense operation.

For performance of a given sense operation, whether the sense circuit controller 1006 configures the latch 1114 to generate the select voltage $V_S$ at its high voltage level and the unselect voltage $V_U$ at its low voltage level, or to generate the select voltage $V_S$ at its low voltage level and the unselect voltage $V_U$ at its high voltage level may depend on whether the ith bit line BL(i) is a selected bit line or an unselected bit line for the sense operation. In particular, for the sense operation, if the sense circuit controller 1006 determines that the ith bit line BL(i) is a selected bit line, then the sense circuit controller 1006 may output the latch control signals to cause the latch 1114 to perform a latch write operation by generating and outputting the select voltage $V_S$ at its high voltage level and the unselect voltage $V_U$ at its low voltage level. Alternatively, if the sense circuit controller 1006 determines that the ith bit line BL(i) is an unselected bit line, then the sense circuit controller 1006 may output the latch control signals to cause the latch 1114 perform a latch write operation by generating and outputting the select voltage $V_S$ at its low voltage level and the unselect voltage $V_U$ at its high voltage level.

In a particular example latch write operation for a sense operation, the sense circuit controller 1006 may control the sense circuit 1100 and may configure the latch 1114. The sense circuit controller 1006 controls the latch 1114 to set the select and unselect voltages $V_S$, $V_U$ to voltage levels that correspond to whether the ith bit line BL(i) is a selected bit line or an unselected bit line.

In addition, the circuitry in the system of FIG. 11 may include a bit line biasing circuit 1116 that is configured to bias the ith bit line BL(i) by generating a bit line bias voltage $V_{BL}$ at a bit line bias node $V_{BL}$. The amount or level of the bit line bias voltage $V_{BL}$ may depend on whether the bit line biasing circuit 1116 is generating the bit line bias voltage $V_{BL}$ during a program stage, a read stage, or a verify stage. During a program stage, the amount of the bit line bias voltage $V_{BL}$ may be further depend on whether the target memory cell MC(T) to which the ith bit line BL(i) is coupled is to have its threshold voltage $V_{TH}$ increased in response to the program pulse or is to be inhibited from having its threshold voltage $V_{TH}$ increased. If the target memory cell MC(T) is to have its threshold voltage $V_{TH}$ increased, then the bit line biasing circuit 1116 may generate the bit line bias voltage $V_{BL}$ at a low voltage level Vpgmb, a non-limiting example of which is 0 Volts. Alternatively, if the target memory cell MC(T) is to have its threshold voltage $V_{TH}$ inhibited from being increased, then the bit lien biasing circuit 1116 may generate the bit line bias voltage $V_{BL}$ at a high voltage level VDDSA, a non-limiting example of which is 3 Volts. During a read or a verify stage during which a sense operation is performed, the bit line biasing circuit 1116 may further depend on whether the ith bit line BL(i) is a selected bit line or an unselected bit line. If the ith bit line BL(i) is an unselected bit line (i.e., the target memory cell MC(T) is an unselected memory cell), then the bit line biasing circuit 1116 may generate the bit line bias voltage $V_{BL}$ at the cell source voltage level Vcelsrc. Alternatively, if the ith bit line BL(i) is a selected bit line (i.e., the target memory cell MC(T) is a selected memory cell), then the bit line biasing circuit 1116 may generate the bit line bias voltage $V_{BL}$ at a high voltage level VBLC, a non-limiting example of which is 0.5 Volts.

In addition, the circuitry in the system of FIG. 11 may include a bit line connection circuit 1118 that is configured to electrically connect and disconnect the ith bit line BL(i) from the sense circuit 1100 and the latch 1114. When the bit line connection circuit 1118 connects the ith bit line BL(i) to the sense circuit 1100, current may flow from the sense circuit 1100 to the ith bit line BL(i). Alternatively, when the bit line connection circuitry 1118 disconnects the ith bit line BL(i) from the sense circuit 1100, current may be prevented from flowing from the sense circuit 1100 to the ith bit line BL(i).

Similarly, the bit line connection circuit 1118 may be configured to electrically connect and disconnect the ith bit line BL(i) from the bit line biasing circuit 1116. When the bit line connection circuit 1118 connects the ith bit line BL(i) to the bit line biasing circuit 1116, the bit line biasing circuit 1116 may bias the bit line bias node $V_{BL}$ by setting the bit line bias voltage $V_{BL}$ to either the high supply voltage level VDDSA or the cell source voltage level Vcelsrc. When the bit line connection circuit 1118 disconnects the ith bit line BL(i) from the bit line biasing circuit 1116, the bit line bias circuit 1116 may be unable to bias the bit line bias node $V_{BL}$.

As previously described, a sense operation may be performed on a group of target memory cells of a block that are connected to the same word line as part of a given read stage of a read operation or a given verify stage of a program-verify operation. For the given read stage of a read operation, the target memory cells are those memory cells in a block from which data values of data are to be determined. For the given verify stage, the target memory cells are those memory cells in a block into which data is being programmed into the memory stage associated with the given verify stage. One or more of the sense blocks 146 shown in FIG. 2B may be perform the sense operations in the read stages or the verify stages. In a single sense operation for the given read stage or the given verify stage, some sense circuits 1002 (FIG. 10) of the one or more sense blocks 146 involved in the one or more sense operations may be connected to selected bit lines while other sense circuits 1002 of the one or more sense blocks 146 may be connected to unselected bit lines. For the single sense operation, a sense circuit controller 1006 (FIG. 10) and/or the control logic 154 (FIG. 2B) may want to know whether current, or a threshold amount of current, is conducting through the selected bit lines. The sense circuit controller 1006 and/or the control logic 154 may not want to know whether current, or the threshold amount of current, is conducting through the unselected bit lines.

The control logic 154 and/or one or more of the sense circuit controllers 1006 of the sense blocks 146 may be configured to select which of the bit lines connected to the target memory cells are to be selected bit lines and which are to be unselected bit lines for the single sense operation. For a given read stage, the control logic 154 and/or the one or more sense circuit controllers 1006 may identify the selected and unselected bit lines according to a predetermined read scheme that is used in order to identify the threshold voltages $V_{TH}$ of the memory cells, and in turn the data values of the data the target memory cells are storing. For a given verify stage, the control logic 154 and/or the one or more sense circuit controllers 1006 may identify the selected and unselected bit lines according to a program scheme that is used to program the target memory cells into various, different programmed states.

In accordance with at least some example program schemes, a single sense operation performed in a verify stage may be associated with a given memory state associated with the verify stage. For the single sense operation, the control logic 154 and/or the one or more sense circuit controllers 1006 may identify a bit line to be a selected bit line if the target memory cell connected to the bit line is assigned to be programmed into the given memory state associated with the single sense operation. Conversely, the control logic 154 and/or the one or more sense circuit controllers 1006 may identify a bit line to be an unselected bit line if the target memory cell is not assigned to be programmed into the given memory state associated with the single sense operation.

The sense circuit 1100 involved in the sense operation described with reference to FIG. 12 may be one of the sense circuits connected to a selected bit line for a single sense operation that is part of a read stage of a read operation or a verify stage of a program-verify operation. The sense circuit 1100 is a circuit that senses a status of the target memory cell MC(T) during a sense operation. As used herein, the status of a target memory cell defines a change in a state of the target memory cell from an initial state such as an erased state or unprogrammed state to a programmed state, or vice versa. Furthermore, in certain embodiments, the status of a target memory cell defines a magnitude of an electrical characteristic of the target memory cell. The electrical characteristic may be the level of resistance, the threshold voltage, or the magnetic field, and/or direction of a magnetic field exhibited by the target memory cell. In particular example configurations, the sense circuit 1100 senses the status of the target memory cell by sensing an amount of current flowing through the ith bit line BL(i) during a sense time period of the sense operation while the word line coupled to the target memory cell MC(T) is biased to a certain voltage level. In another example configuration, the sense circuit 1100 senses the threshold voltage of a target memory cell by biasing the word line connected to the target memory cell to a predetermined threshold voltage and then sensing whether the predetermined threshold voltage activates the target memory cells such that current flows through the ith bit line BL(i) during a sense time period of the sense operation. When the sense operation is part of a read stage, the sense circuit 1100 may be configured to sense the amount of the cell current Icell in a selected bit line to read the data or logic level of data that the target memory cell MC(T) is storing. When part of a verify stage, the sense circuit 1100 may be configured to sense the amount of the cell current Icell to verify that data is sufficiently programmed in the target memory cell MC(T).

Based on the current sensing that the sense circuit 1100 performs, the sense circuit 1100 may generate and output a sense result output signal $V_{SR}$ at a sense circuit output node OUTS that indicates a status of the target memory cell MC(T). As examples, in situations where the sense circuit 1100 performs a sense operation as part of a read stage, the status of the memory cell may be a memory state in which the memory cell MC is programmed. As previously described, the memory state may be one of a plurality of possible memory states in which the memory cell MC can be programmed, examples of which are found in FIGS. 9A-9C. Each of the plurality of memory states may correspond to a different one of a plurality of logic or data values for data that the memory cell MC can store. In turn, an identification of a memory state in which the memory cell MC is in is an identification of the logic or data value of the data that the memory cell MC is storing. Accordingly, where the status of the memory cell MC is the memory state of the memory cell MC, the level of the sense result output signal $V_{SR}$ may indicate the memory state of the memory cell MC and/or the logic value of the data that the memory cell MC is storing. As another example, the status of the memory cell MC is a status of whether a threshold voltage $V_{TH}$ of the memory cell MC is above or below a certain read reference voltage level Vr. Accordingly, the level of the sense result output signal $V_{SR}$ may indicate whether the threshold voltage $V_{TH}$ of the memory cell MC is above or below a certain read reference voltage level Vr.

As another example, in a situation where the sense circuit 1100 performs the sense operation as part of a verify stage, the status of the memory cell MC is a status of whether the memory cell MC is sufficiently programmed to its assigned program state. Accordingly, the level of the sense result output signal $V_{SR}$ may indicate whether the memory cell MC is sufficiently programmed to its assigned memory state, or whether another program operation is needed to sufficiently program the memory cell MC.

In addition or alternatively, the status of the memory cell MC includes an indication of how the memory cell MC behaves or responds and/or a behavior or response of the memory cell MC in response to being biased according to certain biasing conditions during the sense operation. The biasing may include the sense circuit 1100 biasing the bit line BL with a bit line bias voltage, which in turn biases the memory cell MC. Other or additional biasing may include biasing a word line, such as a selected word line, connected to the memory cell MC with a word line voltage at a certain voltage level, such as a certain read voltage level or a certain verify voltage level. The memory cell MC may behave or respond differently to a certain biasing condition depending on its status. That is, memory cells with different statuses may respond differently to the same set of biasing conditions. One way a memory cell MC responds or behaves differently is by drawing different amounts of current through the bit line BL. In other words, the status identified during the sense operation characterizes or indicates a behavior of the memory cell MC in response to being biased during the sense operation, which in turn indicates the status of the memory cell MC, and which in turn indicates certain information for which the sense operation is performed, such as the data value that the memory cell MC is storing, whether the memory cell MC has a threshold voltage $V_{TH}$ above or below a certain read voltage level, or whether the memory cell MC is sufficiently programmed.

Accordingly, the function of sensing a status of a target memory cell in FIG. 11 is a performed by a sense circuit having a circuit structure that connects to a bit line coupled to the target memory cell by way of a bit line connection circuit, and is configured to perform current sensing by enabling or forming a current path that allows an amount of current to flow through it to the bit line to the bit line by way of the bit line connection circuit. Other structural configurations for performing the function of sensing a status of a target memory cell in the system of FIG. 11 may be possible. For example, other types of sense circuit may be connected to the selected word line instead of the selected bit line and determine the status of the target memory cell based on current flow drawn through the selected word line. Other example sense circuits may sense a voltage on the word line or the bit line without necessarily having that voltage be dependent on current drawn through the target memory cell. For such configurations, the sense circuit performs voltage sensing rather than current sensing to determine status of the target memory cell. Other types of sense circuits may sense a response characteristic of a target memory cell other than a voltage level or current amount. For example, the sense circuit may sense a frequency of a voltage or current generated from the memory cell in response to certain biasing conditions. In addition or alternatively, the sense circuit may include circuit components that sense a transient, such as a rate at which current or voltage generated by the memory cell increases or decreases, the rate of which in turn may indicate a status of the memory cell. Various other types of memory sense circuit configurations may be possible.

The sense circuit controller 1006, the sense circuit 1100, the latch 1114, the bit line biasing circuit 1116, and the bit line connection circuit 1118 are configured to operate and/or communicate together to perform a sense operation in a read stage or a verify stage. During the sense operation, the sense circuit 1100 is configured to sense an amount of current that flows through the ith bit line BL(i) during a sense time period of the sense operation. After the sense time period, the sense circuit 1100 may generate the sense result output signal $V_{SR}$ at the output node OUTS that indicates the amount of sensed current, which in turn indicates the status of the target memory cell MC(T).

The sense circuit controller 1006 may facilitate or control the sense operation by outputting control signals to the sense circuit 1100, and in some embodiments also to one or more of the latch 1114, the bit line biasing circuit 1116, and the bit line connection circuit 1118. FIG. 11 shows the sense circuit controller 1006 configured to output one or more sense circuit control signals 1126 to the sense circuit, one or more latch control signals to the latch 1114, one or more bit line biasing control signal to the bit line biasing circuit 1116, and one or more bit line connection control signals to the bit line connection circuit 1118. In particular example configurations, a control signal output from the sense circuit controller 1006 is a voltage signal generated at a voltage level and applied to an input terminal of a transistor to turn on or turn off the transistor.

As examples, the sense circuit controller 1006 may output the bit line biasing control signal(s) to control whether the bit line biasing circuit 1116 sets the bit line bias voltage $V_{BL}$ to the high supply voltage level VBLC or the cell source voltage level Vcelsrc. The sense circuit controller 1006 may output the bit line bias control signal(s) to control whether the bit line connection circuit 1118 electrically connects the sense circuit 1100 and/or the bit line biasing circuit 1116 to the ith bit line BL(i).

In addition, the sense circuit controller 1006 may output the sense circuit control signals to control sensing performed by the sense circuit 1100 to sense a status of the target memory cell MC(T). For at least some sense operations, the sense circuit 1100 senses a status of the target memory cell MC(T) by: forming an internal current path for a sense time period, and generating the sense result output signal $V_{SR}$ at a level indicative of the amount of current flowing through the internal current path for the sense time period. The internal current path electrically connects to the ith bit line BL(i) to allow for current flow. Based on a status of the target memory cell (T), the target memory cell MC(T) will draw a certain amount of current, which will flow in the internal current path to the ith bit line BL(i). Accordingly, the sense circuit controller 1006 may control the sensing performed by the sense circuit 1100 by outputting a sense circuit control signal to an internal switch (e.g., transistor) to turn on the internal switch at the start of the sense time period and turn off the internal switch at the end of the sense time period. In addition, the sense circuit 1100 may control the sensing performed by the sense circuit by outputting one or more sense circuit control signals that cause the sense circuit 1100 to turn on a switch in order generate the sense result output signal $V_{SR}$ at a level indicative of the amount of current that flowed through the internal current path to the ith bit line BL(i).

Also, in some example configurations, the sense circuit 1100 may sense a status of the target memory cell MC(T) by generating a voltage at an initial predetermined level on an internal node, such as a sense node, prior to the sense time period. Charge accumulated at the internal node in response to generating the voltage at the predetermined level may provide the current flow through the internal current path during the sense time period. A voltage level of the voltage generated on the internal node at the end of the sense time period may correspond to the amount of current that flowed through the internal current path. Accordingly, in some example configurations, the sense circuit 1100 may further sense a status of the target memory cell MC(T) by generating a voltage on an internal node at a level corresponding to an amount of current flow through the internal current path during the sense time period, and generating the sense result output signal $V_{SR}$ based on the level of the voltage on the internal node at the end of the sense time period. The sense circuit controller 1006 may further control the sense operation by outputting or controlling the output of a voltage signal, such as in the form of a voltage pulse, to cause the sense circuit 1100 to generate the voltage on the internal node at the initial, predetermined level.

In addition, the sense circuit controller 1006 may output the latch control signal(s) to cause the latch 1114 to perform a write operation or a read operation, and/or to set the select and unselect voltages $V_S$, $V_U$ at respective voltage levels depending on whether the ith bit line BL(i) is a selected or an unselected bit line. For example, at the start of a sense operation, if the ith bit line BL(i) is a selected bit line, the sense circuit controller 1006 may output the latch control signal(s) to cause the latch 1114 to output the select voltage $V_S$ at an associated high voltage level and the unselected voltage $V_U$ at an associated low voltage level, and if the ith bit line BL(i) is an unselected bit line, the sense circuit controller 1006 may output the latch control signal(s) to cause the latch 1114 to output the select voltage $V_S$ at an associated low voltage level and the unselected voltage $V_U$ at an associated high voltage level. Also, at the end of the sense operation, such as after the sense time period, the sense circuit controller 1006 may output the latch control signals to the latch 1114 to cause the latch 1114 to perform a read operation to read the voltage level of the sense result output signal $V_{SR}$. In response to receipt of the latch control signal(s) to perform a read operation, the latch 1114 may read the voltage level of the sense result output signal $V_{SR}$ by setting the select and unselect voltages $V_S$, $V_U$ to respective voltage levels indicative of the level of the sense result output signal $V_{SR}$. For example, where the ith bit line BL(i) is a selected bit line, in response to receipt of the latch control signal(s) to cause the latch 1114 to perform a read operation, the latch 1114 may either maintain the select voltage $V_S$ at the associated high level and the unselect voltage $V_U$ at the associated low level, or switch the select voltage $V_S$ to the associated low level and the unselect voltage $V_U$ to the associated high level. The output of the latch control signal(s), and the performance of a read operation by the latch 1114 after the sense time period may be referred to as a data read out (or simply read out). In some example configurations, the sense circuit controller 1006, or some other circuitry on the memory die, may identify whether the latch 1114 maintained or switched the voltage levels of the select and unselect voltages $V_S$, $V_U$ during the sense operation in order to determine the status of the target memory cell MC(T).

In addition to the sense circuit control signals, one or more of the bit line biasing control signal(s), the bit line connection control signal(s), and the latch control signal(s) are part of the control signals that the sense circuit controller 1006 outputs to facilitate and/or control the sense operation.

The sense circuit controller 1006, in combination with the sense circuit 1100, latch 1114, the bit line biasing circuit 1116, and/or the bit line connection circuit 1118, may perform a sense operation in a plurality of time periods, stages, and/or portions. When performing the sense operation as part of a read stage or a verify stage, the time periods of the sense operation are considered time periods of the read or verify stage, the stages of the sense operation are considered sub-stages of the read or verify stage, and the portions of the sense operation are considered portions of the read or verify stage.

In addition, the sense circuit controller 1006 may be configured to output the control signals during a sense operation according to a sequence that identifies timing relationships as to when to output the control signals. To briefly illustrate, if the bit line connection circuit 1118 needs to connect the ith bit line BL(i) to the sense circuit 1100 in order for current to flow in the internal current path to the ith bit line BL(i), then as part of the sequence, the sense circuit controller 1006 will be configured to output the bit line connection control signal(s) to connect the ith bit line BL(i) to the sense circuit 1100 before the sense circuit controller 1006 outputs a sense circuit control signal to form the internal current path in the sense circuit 1100.

In addition, the sense circuit controller 1006 is configured to output the control signals according to the sequence relative to the plurality of time periods into which the sense operation is divided or separated. For a given sense operation, the sense circuit controller 1006 is configured to identify the plurality of time periods of the sense operation, and know how to act or function in each of the time periods. That is, in each time period, the sense circuit controller 1006 is configured to take no action, such as by not changing a voltage level of any control signal it is outputting, or output at least one of the control signals, such as by changing a voltage level of a control signal to turn on or turn off a switch in the sense circuit 1100, the latch 1114, the bit line biasing circuit 1116, or the bit line connection circuit 1118. Accordingly, by identifying a time period of a sense operation, the sense circuit controller 1006 knows which of the control signals to output in that time period and when to output those identified control signals in the time period relative to a start time of the time period. Additionally, the sense circuit controller 1006 is also configured to identify time durations of each of the time periods. During the sense operation, the sense circuit controller 1006 will identify when a time period starts and continually keep track of how much time has elapsed in the time period from the start time. By knowing the time duration for the time period, the sense circuit controller 1006 will know when the time period ends and the next time period begins. The sense circuit controller 1006 may proceed in this manner until a last time period of the sense operation has ended.

As described in further detail below, it may be desirable for the sense circuit 1100 to wait to sense the status of the target memory cell MC(T) during a verify stage or a read stage until a settled time is reached. A settled time is reached when a bias line voltage generated on a bias line during a sense operation has settled to a relatively constant or stable final level. That is, when the settled time is reached, the bias line voltage stays (or at least is assumed to stay) within a predetermined, acceptable range around the final level, such as a range that accounts for a small amount of variation due to noise on the bias line. The bias line is either a word line or a bit line. Accordingly, the bias line voltage refers to the word line voltage $V_{WL}$ where the bias line is a word line, and the bias line voltage refers to the bit line voltage $V_{BL}$ when the bias line is a bit line. Prior to the settled time, controlling the sense circuit to perform a sense operation, such as by drawing current through the internal path, generating its sense result output signal $V_{SR}$ to indicate the amount of current drawn, and/or controlling the latch 1114 to read the level of the sense result output signal $V_{SR}$, may lead to the sense circuit 1100 outputting the sense result output signal $V_{SR}$ at the wrong level (i.e., at a level that incorrectly indicates the status of the target memory cell MC(T) and/or the latch 1114 reading the wrong level so that the levels of its select and unselect voltages $V_S$, $V_U$ incorrectly identify the status of the target memory cell MC(T). At the same time, waiting too long after the settled time occurs unnecessarily lengths the sense operation. The system in FIG. 11 avoids the pitfalls of sensing too early or too late by dynamically setting one or more time periods of a sense operation in one or more verify stages in a program-verify operation, and/or by dynamically setting one or more time periods of a sense operation in one or more read stages of a read operation. Doing so will allow different program-verify operations and/or different read operations to optimally finish at different times to accommodate for the different settled times. In turn, sense operations performed within program-verify operations will not finish too soon nor take too long.

To do so, the system includes or is in communication with a detection circuit and a timing circuit. The detection circuit is component, or module, designed, and built, to measure the time required for a control line to change voltage bias levels from an initial bias level to a target voltage bias level. In certain embodiments, the detection circuit may comprise hardware, firmware, or a combination of hardware and software or firmware. For example, a detection circuit may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, a detection circuit may include memory hardware that comprises instructions executable with a processor or processor circuitry to implement one or more of the features of the detection circuit. The detection circuit (which may be a flash memory controller in certain embodiments) can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller.

In one embodiment, the detection circuit is a circuit that detects a time duration for a bias line voltage of a bias line to reach a predetermined threshold voltage level. As mentioned, a bias line is a conductive line coupled to the target memory cell MC(T), such as the selected word line or the ith bit line BL(i).

The example configuration of FIG. 11 includes two detection circuits, including a bit line pre-charge detection circuit 1108 and a word line detection circuit 1110. As described in further detail below, the bit line pre-charge detection circuit 1108 detects when a bit line voltage reaches a threshold voltage level, and the word line detection circuit 1110 detects when the word line voltage reaches a threshold voltage level. Other embodiments detect only the bit line voltage and thus include the bit line pre-charge detection circuit 1108 but not the word line detection circuit 1110. Still other embodiments detect only the word line voltage 1110 and thus include the word line detection circuit 1110 but not the bit line pre-charge detection circuit 1108.

In general, a time duration is a time period or an amount of elapsed time extending from a start time to an end time. The time duration may be measured or quantified using a certain unit of measurement. In some embodiments, the unit of measurement is an actual unit of time, such as seconds (nanoseconds, microseconds, milliseconds, etc.). In other embodiments, the unit of measurement is a quantified, measured or discrete number identified by counting from the start time to the end time, such as a number of clock cycles, clock pulses, rising edges, falling edges, or combinations thereof, of a signal, such as a clock signal, that occur from the start time to the end time.

In addition, the start time is a time that a bias line voltage starts changing, such as by increasing, from an initial, predetermined voltage level. In addition or alternatively, the start time is a time that the detection circuit is configured to identify as being when the bias line voltage starts changing, irrespective of whether the bias line voltage actually does start changing. Additionally, the initial, predetermined voltage is a voltage level that the bias line voltage is configured to be at prior to and/or at the start of a stage of a program-verify operation or a read operation. In some example configurations, the initial voltage level is a ground reference voltage level, such as 0 volts (V) or the cell source voltage level Vcelsrc, although other initial, predetermined voltage levels may be possible. In addition, the bias line voltage level may change as a function of time. In particular example configurations, the bias line voltage may start changing by increasing from the initial voltage level, although other configurations where the bias line voltage starts to change by decreasing from the initial voltage level may be possible.

A biasing circuit is configured to control the voltage level of the bias voltage generated on the bias line. In FIG. 11, one biasing circuit is the bit line biasing circuit 1116 configured to control voltage levels of bit line voltages generated on the bit lines. Another biasing circuit is the word line biasing circuit 1103 configured to control the voltage levels of word line voltages generated on the word lines. A biasing circuit is configured to change or adjust the voltage level of the bias line voltage between a minimum voltage level and a maximum voltage level. In particular example configurations, such as that shown in FIG. 11, during a program stage, the biasing circuit is configured to bias the bit line bias nodes VBL of the bit lines being programmed to the low voltage level Vpgmb, which may be 0 volts for example, and bias the bit lines being inhibited to the high or the maximum voltage level, which may be the high program voltage level VDDSA, such as 3 volts for example. During a read or verify stage during which a sense operation is performed, the bit line biasing circuit 1116 may bias the bit line bias nodes VBL of unselected bit lines to the minimum voltage level, which may be the initial voltage level, such as the cell source voltage level Vcelsrc, and may bias the bit line bias nodes VBL of selected bit lines to the high voltage level VBLC, such as 0.5 volts for example. In other example configurations, however, the maximum voltage level is the initial voltage level, such as ground or the cell source voltage level Vcelsrc, and the minimum voltage level is lower than the initial voltage level and/or the cell source voltage level Vcelsrc. In general, a predetermined threshold voltage level is a voltage level in between the minimum voltage level and the maximum voltage level. In particular example configurations, the predetermined threshold voltage level is a percentage or a fraction of the maximum voltage level or the minimum voltage level. As described below, in some example configurations, the predetermined threshold voltage level is 70% of the high supply voltage level VDDSA. Various other ways of setting or identifying the predetermined voltage level may be possible.

The end time marking the end of the time duration is a time that the detection circuit detects that the bias line voltage has reached the threshold voltage level. As described in further detail below, one way that the detection circuit detects when bias line voltage has reached the predetermined threshold voltage level is by including a comparator that receives a reference voltage at the predetermined threshold voltage level. The comparator also receives the bias line voltage. During the time duration, the comparator compares, such as by continuously comparing, the voltage level of the bias line voltage with the reference voltage. At a given moment in time, the comparison indicates that the bias line voltage is the same as the reference voltage, that the bias line voltage level has transitioned from being below to above the reference voltage level, or that the bias line voltage level has transitioned from being above to below the reference voltage level. At that time, the detection circuit may detect that the bias line voltage has reached the threshold voltage level, marking the end time of the time duration.

The time duration for the bias line voltage to change from the initial voltage level to the predetermined threshold voltage level may be different when biasing different bias lines or at different times that the biasing circuit biases the same bias line. As such, the bias line may detect different time durations when the biasing circuit is biasing different bias lines, or the biasing same bias line but at different moments in time during the life of the memory system 100.

In addition, for some example configurations as described in further detail below, the detection circuit may be configured to detect when the bias voltage reaches the threshold voltage level during a program-verify operation. For these configurations, the bias line may be a bit line on which a bit line voltage is generated, and the detection circuit detects when the bit line voltage reaches the threshold level during a pre-charge stage of the program-verify operation. As previously described, the pre-charge stage is an initial stage or a stage before the program stage of the program-verify operation during which bit line biasing circuitry biases a first set of bit lines to allow memory cells coupled to the first set of bit lines to increase their threshold voltage levels in response to a program pulse in a next program stage, and biases a second set of bit lines to prevent or inhibit memory cells coupled to the second set of bit lines from increasing their threshold voltage levels in response to the program pulse in the next program stage.

In other example configurations, the detection circuit is configured to detect when the bias voltage reaches the threshold voltage level during a read operation. For these other example configurations, the bias line may be a word line on which a word line voltage is generated, and the detection circuit detects when the word line voltage reaches the threshold level during an initial word line charging portion of a first read stage of the read operation. As described in further detail below with respect to FIG. 16, the initial word line charging portion (or just word line charging portion) is an initial period of the read operation during which the word line biasing circuit 1103 increases the word line voltage $V_{WL}$ to a voltage read spike voltage level before a sense operation starts, or at least finishes, in the initial read stage of the read operation.

The circuitry of FIG. 11 can leverage the time duration detected in the pre-charge stage of a program-verify operation, and/or can leverage the time duration detected in the initial word line charging portion of a read operation. In order to leverage the time duration detected by the detection circuit for program-verify operations, one embodiment of the solution further includes a timing circuit 1112. The timing circuit 1112 is a component, or module, designed, and built, to adjust, set, revise, report, provide, determine, or define a verify time used in a verify stage of a program-verify operation or, as described in further detail below regarding read operations, may define a read time of a read operation.

In certain embodiments, the timing circuit 1112 may comprise hardware or a combination of hardware and software or firmware. For example, a timing circuit 1112 may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, a timing circuit 1112 may include memory hardware that comprises instructions executable with a processor or processor circuitry to implement one or more of the features of the detection circuit. The timing circuit 1112 (which may be a flash memory controller in certain embodiments) can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller.

For program-verify operations, the timing circuit 1112 sets, or determines, a verify time for use during a verify stage of the program-verify operation. The verify time is a time, such as an instantaneous time, that occurs in the verify stage. As described in further detail below, a verify stage may include and/or extend over a plurality of predetermined time periods. The verify time may be an end time of one of the time periods, a start time of one of the time periods, or both an end time for a first time period and a start time for a second time period occurring immediately after the first time period. Alternatively, the verify time may be a time occurring a predetermined amount of time after an end time and/or after a start time of one of the time periods of the verify stage that occurs at some point in between a start time and an end time of the time period.

The sense circuit controller 1006 may be configured to identify the verify time that the timing circuit 1112 determines or sets. In response to identifying the verify time, the sense circuit controller 1006 may be configured to perform some action associated with a sense operation of the verify stage. For example, in response to identification of the verify time, the sense circuit controller 1006 may output a control signal to the sense circuit 1100 that causes the sense circuit 1100 to form or enable an internal current path to allow current to flow to the ith bit line during a sense period of the sense operation. In addition, or alternatively, the sense circuit controller 1006 may output a control signal to the sense circuit 1100 to cause the sense circuit to output its sense result output signal $V_{SR}$ at a level indicative of the status of the target memory cell MC(T) and/or the amount of current that flowed through the internal current path. In addition or alternatively, the sense circuit controller 1006 may output one or more latch control signals to the latch 1114 to cause the latch 1114 to read the level of the sense result output signal $V_{SR}$.

In some embodiments, the sense circuit controller 1006 is configured to perform the action associated with the sense operation in response to identification of the verify time by performing the action when the verify time occurs. In other embodiments, the sense circuit controller 1006 is configured to perform the action a predetermined amount of time after occurrence of the verify time. In either case, by identifying the verify time that the timing circuit 1112 sets, the sense circuit controller 1006 knows the time in the verify stage at which to perform the action associated with the sense operation.

In addition, for some program-verify operations, the timing circuit 1112 may set and/or determine the verify time directly by identifying the verify time itself, such as by identifying a particular time that occurs after the start of a verify stage in which the verify time occurs. In other program-verify operations, the timing circuit 1112 may set or determine the verify time indirectly by identifying a verify time period, and in particular, an amount of the verify time period. The verify time period, such as an end of the verify time period, may indicate the verify time and/or when the verify time occurs. For example, the verify time may be the end time of the verify time period, or may be a time that occurs a predetermined amount of time after the end of the verify time period. Accordingly, by identifying the amount of time of the verify time period, the sense circuit controller 1006 will know when the end of the verify time period occurs, and in turn when the verify time occurs.

For at least some of the embodiments where the timing circuit 1112 sets or determines a verify time period, the verify time period is one of the plurality of predetermined time periods of the verify stage. In particular embodiments, the verify time period is a bit line settling time period of the plurality of time periods of the verify stage. The end time of the bit line settling time period is a bit line settled time. As described, the bit line settled time is a time at which the sense circuit controller 1006 identifies that the bit line voltage will be stable by staying within a predetermined, acceptable range around a final bit line voltage level, such as a range that accounts for a relatively small amount of variation due to noise on the bit line, during a remaining portion of a sense operation. For such configurations, the verify time may be the bit line settled time at the end of the bit line settling time period, or alternatively, the verify time may be a time that occurs a predetermined amount of time after the bit line settled time. Accordingly, for these particular embodiments, the timing circuit 1112 sets the verify time in the verify stage by setting or determining the bit line settling time period since, by doing so, the sense circuit controller 1006 will know or identify when the verify time occurs.

In some example configurations, a system may include a buffer that is configured to store a data structure, such as a table, that lists or otherwise includes a plurality of verify times. Particularly, the data structure may list a plurality of verify times or a plurality of verify time periods, each corresponding to a different one of a plurality of time durations. In this context, the term buffer is used to refer to a memory component that is able, and has capacity, to store, such as temporarily store, a data structure or table that associates a plurality of time durations with a plurality of verify times and/or a plurality of verify time periods. The verify time or the verify time period that the timing circuit 1112 selects from the data structure corresponds to the time duration detected during a pre-charge stage. In other example configurations, the timing circuit 1112 is configured to use an algorithm, function, formula, equation, or the like, that can receive the detected time duration as an input and output a verify time or a verify time period with a value dependent on the detected time duration and the algorithm/function/formula/equation.

The timing circuit 1112 may further be configured to set the verify time by providing or outputting the verify time, or some other information, such as a verify time period (e.g., a bit line settling time period) to the sense circuit controller 1006. Consequently, when the sense circuit controller 1006 executes a verify stage, the sense circuit controller 1006 outputs one or more control signals to the sense circuit 1100, the latch 1114, the bit line biasing circuit 1116, and/or the bit line connection circuit 1118 relative to the verify time to facilitate or control the sense operation. For example, the sense circuit 1100 may form an internal current path during a sense period to allow current to flow to the ith bit line BL(i), the sense circuit 1100 may generate the sense result output signal $V_{SR}$ at a level indicative of the status of the target memory cell MC(T), and/or the latch 1114 may read the level of the sense result output signal $V_{SR}$ at times or during time periods that occur relative to occurrence of the verify time, the verify time period, and/or the bit line settling time period.

In particular example configurations where the timing circuit 1112 outputs a bit line settling time period to the sense circuit controller 1006, the sense circuit controller 1006 determines how long the bit line settling period of the verify stage is to be and will determine when the bit line settling period will end (e.g., when the settled time occurs). Relative to the ending of the bit line setting period, the sense circuit controller 1006 will output one or more control signals to the sense circuit 1100, which in turn causes the sense circuit 1100 to sense the status of the target memory cell MC(T) relative to the bit line settling period.

Accordingly, the bit line pre-charge detection circuit 1108 detects the time duration of the bit line voltage to reach the threshold voltage level during the pre-charge stage, and the timing circuit 1112 leverages this detected time duration by identifying an amount of the bit line settling time period corresponding to the detected time duration. Ultimately, during a program-verify operation, the sense circuit controller 1006 identifies the amount of the bit line settling period and controls the sense circuit 1100 and/or the latch 1114 to perform at least a portion of the sense operation in a verify stage at times dependent on the time duration of the bit line voltage to reach the threshold level during the pre-charge stage.

In addition, in order to leverage the time duration detected by the detection circuit for read operations, the timing circuit 1112 is configured to set a read time during a read stage of the read operation. The read time, like the verify time, is a time that the sense circuit controller 1006 identifies as occurring in the read stage, and in response to the identification, performs some action associated with sensing performed by the sense circuit 1100 during a sense operation of the read stage, such as causing the sense circuit 1100 to form or enable an internal current path, causing the sense circuit to output its sense result output signal $V_{SR}$ at a level indicative of the program state of the target memory cell MC(T) and/or the amount of current that flowed through the internal current path, or causing the latch 1114 to read the level of the sense result output signal $V_{SR}$.

In addition, for read operations, the timing circuit 1112 may set and/or determine the read time by identifying the read time itself or by identifying a read time period, and in particular an amount of the read time period, that indicates the read time and/or when the read time occurs. In particular example configurations, the read time period is a word line settling time period, the ending of which is a word line settled time. As described, the word line settled time is a time at which the sense circuit controller 1006 identifies that the word line voltage will be stable by staying within a predetermined, acceptable range around a final word line voltage level, such as a range that accounts for a relatively small amount of variation due to noise on the word line, during a remaining portion of a sense operation. Accordingly, the timing circuit 1112 sets the read time in the read stage by setting, determining, or identifying the word line settling time period since, by doing so, the sense circuit controller 1006 will know or identify when the read time occurs.

In addition, similar to how the timing circuit 1112 sets the verify time, the timing circuit 1112 may identify the read time, read time period, or word line settling time period by selecting the read time/read time period/word line settling time period by selecting the read time/read time period/word line settling time period from one of a plurality of read times/read time periods/word line settling time periods available or accessible to the timing circuit 1112. In some example configurations, as with operation of the timing circuit 1112 for program-verify operations, the system may include a buffer 1128 that is configured to store a data structure, such as a table, that lists or otherwise includes a plurality of plurality of read times/read time periods/word line settling time periods, and the timing circuit 1112 makes its selection from the buffer 1128. In other example configurations, the timing circuit 1112 is configured to use an algorithm, function, formula, equation, or the like, that can receive the detected time duration as an input and output a read time/read time period/word line settling time period with a value dependent on the detected time duration and the algorithm/function/formula/equation.

Additionally, the timing circuit 1112 may provide or output the read time/read time period/word line settling time period to the sense circuit controller 1006 for read operations. In doing so, the sense circuit controller 1006 will know what the read time/read time period/word line settling time period is. Consequently, when the sense circuit controller 1006 is executing a read stage, the sense circuit controller 1006 is configured to output one or more control signals to the sense circuit 1100, the latch 1114, the bit line biasing circuit 1116, and/or the bit line connection circuit 1118 relative to the read time/read time period/word line settling time period to facilitate or control the sense operation. For example, the sense circuit 1100 may form an internal current path during a sense period to allow current to flow to the ith bit line BL(i), the sense circuit 1100 may generate the sense result output signal $V_{SR}$ at a level indicative of the status of the target memory cell MC(T), and/or the latch 1114 may read the level of the sense result output signal $V_{SR}$ at times or during time periods that occur relative to occurrence of the read time/read time period/word line settling time period.

In particular example configurations where the timing circuit 1112 outputs a word line settling time period to the sense circuit controller 1006, the sense circuit controller 1006 knows how long the word line settling period of the read stage is to be and will know when the word line settling period will end (e.g., when the word line settled time occurs). Relative to the ending of the word line setting period, the sense circuit controller 1006 will output one or more control signals to the sense circuit 1100, which in turn causes the sense circuit 1100 to sense the program state of the target memory cell MC(T) relative to the word line settling time period.

Accordingly, the word line detection circuit 1110 detects the time duration of the word line voltage to reach the threshold voltage level, and the timing circuit 1112 leverages this detected time duration by identifying an amount of the word line settling time period corresponding to the detected time duration. Ultimately, during a read operation, the sense circuit controller 1006 identifies the amount of the word line settling period and controls the sense circuit 1100 and/or the latch 1114 to perform at least a portion of the sense operation in a read stage at times dependent on the time duration of the word line voltage to reach the threshold level during the initial word line charging portion of a read operation.

Additional details of certain components shown in FIG. 11 are discussed below, including the bit line pre-charge detection circuit 1108, the word line detection circuit 1110, and the timing circuit 1112. The bit line pre-charge detection circuit 1108 is configured to detect a time duration for the bit line voltage $V_{BL}$ generated on the ith bit line BL(i), such as at the bit line biasing node $V_{BL}$, to reach a predetermined or target voltage level (or a pre-charge target voltage level). To do so, in the example configuration of FIG. 11, the bit line pre-charge detection circuit 1108 may include a comparator circuit (COMP) 1109 that is connected to the bit line biasing node VBL for the selected bit line BL(i) at a first input and to a reference voltage at the pre-charge target voltage level, at a second input. The comparator circuit 1109 may be implemented as an analog circuit that includes an operational amplifier (op-amp) having positive and negative input terminals. The reference voltage may be input to the positive input terminal and the bit line voltage may be input to the negative input terminal such that the output of the op-amp comparator is at a low level and then switches to a high level when the bit line voltage exceeds the threshold level of the reference voltage.

As described in greater detail below, the bit line pre-charge detection circuit 1108 will, during a pre-charge stage of a program-verify operation, compare the bit line bias voltage $V_{BL}$ to the pre-charge target voltage level and output a state change signal when the bit line bias voltage $V_{BL}$ sensed exceeds the pre-charge target voltage level applied. Accordingly, for such configurations, the bit line pre-charge detection circuit 1108 detects the time duration for the bit line voltage $V_{BL}$ to reach the threshold voltage level by monitoring the voltage level of the bit line voltage $V_{BL}$, comparing the bit line voltage $V_{BL}$ to the target threshold level, and outputting the state change signal at a changed voltage level to indicate the end of the time duration. The timing circuit 1112 is configured to measure an amount of the time duration by identifying the change in level of the state change signal it receives from the bit line pre-charge detection circuit 1108.

Similarly, the word line detection circuit 1110 is configured to detect a time duration for the word line voltage $V_{WL}$ of the selected word line WL(S) to reach a threshold or target voltage level during an initial word line charging portion of a read stage. To do so, in the example configuration in FIG. 11, the word line detection circuit 1110 may include a comparator circuit (COMP) 1111 that, during a first, word line charging portion of an initial read stage in a read operation, receives the word line voltage $V_{WL}$ from the selected word line WL(S) at a first input and compares that to a predetermined reference voltage at a threshold or target voltage level, for example a voltage read spike target voltage (as described in further detail with respect to FIG. 16) at a second input of the comparator circuit 1111. The comparator circuit 1111 may be implemented in the same way as the comparator circuit 1109, as an analog circuit that includes an operational amplifier (op-amp) having positive and negative input terminals. The reference voltage may be input to the positive input terminal and the word line voltage may be input to the negative input terminal such that the output of the op-amp comparator is at a low level and then switches to a high level when the bit line voltage exceeds the threshold level of the reference voltage.

Similar to the output of the bit line pre-charge detection circuit 1108, the output of the word line detection circuit 1110 is a state change signal that toggles when the detected word line voltage $V_{WL}$ from the selected word line WL(S) exceeds the predetermined or target voltage level. Accordingly, for such configurations, the word line detection circuit 1110 detects the time duration for the word line voltage $V_{WL}$ to reach the threshold voltage level by monitoring the voltage level of the word line voltage $V_{WL}$, comparing the word line voltage $V_{WL}$ to the target threshold level, and outputting the state change signal at a changed voltage level to indicate the end of the time duration. As described in further detail below, the timing circuit 1112 is configured to measure an amount of the time duration by identifying the change in level of the state change signal it receives from the word line detection circuit 1110.

For each of the detection circuits 1108, 1110, the state change signal that is output may be a constant low voltage output until the monitored bit line (for the bit line pre-charge detection circuit 1108) or word line (for the word line detection circuit 1110) exceeds respective threshold voltage level, at which point the state change signal may change to a constant high voltage. The high and low voltages may be 3 volts and 0 volts, respectively, or any of a number of other predetermined voltage levels. In different implementations, the state change signal output may alternatively be a high voltage to low voltage change, or may be any of a number of discrete pulses rather than constant voltage outputs. Additionally, the respective pre-charge target voltage for the bit line pre-charge detection circuit 1108 and the word line detection circuit 1110 may be any of a number of predetermined reference voltages. The detection circuits 1108, 1110, as described in greater detail below, may be selectively activated by the sense circuit controller 1006 during the initial stage of a program-verify operation (activating the bit line pre-charge detection circuit 1108) or during the initial stage of a read operation (activating the word line detection circuit 1110) to detect when the selected bit line or word line, respectively, has been pre-charged to the respective target voltage level.

Accordingly, the function for detecting when a bit line voltage or word line voltage reaches a threshold level is performed in FIG. 11 using a structure that includes an analog op-amp comparator circuit that receives a reference voltage at a positive input terminal and the bit line or word line voltage at the negative input terminal. Other structures for detecting when the bit line or word line voltage reaches the threshold level may be possible. For example, the bit line precharge detection circuit 1108 or the word line detection circuit 1110 may include or utilize a circuit breaker, relay, or other switch that turns off when a bit line or word line voltage exceeds a level, a digital comparator, a comparator that includes a processor executing software, and/or a voltage sensor that continuously measures a voltage and inputs a signal indicative of the level to a digital measurement, as non-limiting examples.

The timing circuit 1112 may be configured to determine or set a verify time during a verify stage of the program-verify operation including the bit line pre-charge stage during which bit line pre-charge the detection circuit 1108 identified the time duration for the bit line voltage to reach the threshold level. To do so, in the example configuration shown in FIG. 11, the timing circuit 1112 may include a counter 1122 and verify detection logic 1124. An example counter 1122 is a hardware counter circuit, such as one that includes flip-flops configured to receive a clock signal CLK, count by counting clock pulses of the clock signal CLK, and start and stop the counting based on a level of the state change signal received from the bit line pre-charge detection circuit 1108 or the word line detection circuit 1110. The counter 1122 is arranged to receive a clock signal CLK and to receive state change signals from the detections circuits. The clock signal CLK may be any steady clock signal generated by, or received and distributed on the die by, clock signal circuitry on the die 104 of the storage device 100. Under control of the sense circuit controller 1006, the counter 1122 of the timing circuit 1112 will, for a program-verify operation, track the number of CLK pulses from the beginning of an initial bit line pre-charge stage in a program-verify operation to when the state change signal from the bit line pre-charge detection circuit 1108 indicates that the pre-charge target voltage has been reached. Similarly, for read operations, the counter 1122 tracks, during a first read stage of the read operation, the total number of CLK pulses from the beginning of an initial Vread spike voltage applied to the selected word line until the state change signal from the word line detection circuit 1110 is triggered to indicate the time that the target Vread spike voltage has been reached.

The counter value determined by the counter 1122, which is the time duration recorded for the selected bit line or word line charging at the beginning of a program-verify operation or read operation, respectively, represents a real-time measure of the current parasitic capacitance or capacitive coupling and its effect on the performance (speed) of the selected bit line or word line. The root causes of the stray capacitance, and the variance of that stray capacitance, affecting a particular bit line or word line may be many. The higher the total capacitance affecting the bit line or word line, the slower the response time is for operations on that bit line or word line due to the RC time constant that generally governs how quickly a voltage can rise or fall on the bit line or word line. The physical properties of memory device, including the material type and dimensions, the particular location of the selected bit line or selected word line in the overall memory array or on the die in which the memory array resides, changes in temperature and data input pattern on adjacent bit lines, all can contribute to performance and performance variability between bit lines and word lines over time.

As will be described in greater detail, the sensed time duration of a charging pulse on a bit line in an initial stage of a program-verify operation may be used to adjust the timing of other stages of the same program-verify operation to account for the current performance level of the bit line. Similarly, in the context of a read operation on a word line, the sensed time duration of a voltage spike applied to the word line at the beginning of an initial read stage for a read operation may be used to adjust the timing of stages of that same read operation to account for the current performance level of the word line.

Referring again to FIG. 11, the timing circuit 1112 takes the time duration measured by the counter 1122, for example a total or cumulative number of clock pulses CLK described above for the initial bit line charging in a program-verify operation, or the initial word line charging for a read operation, and determines a set of one or more timing values that may be applied to set or adjust timing of predetermined portions of stages in the same program-verify operation or read operation. The verify detection logic 1124, which may be part of the control logic 154 (FIG. 2B), receives the time duration information from the counter 1122. In the example implementation shown in FIG. 11, the verify detection logic 1124 includes a buffer 1128 or other memory having a data structure, such as a table, of measured time durations mapped to subsequent timing adjustments for other portions of the same program-verify operation (verify timing adjustments) or read operation (read timing adjustments) involving the bit line or word line.

Accordingly, the function for setting a verify time, bit line settling time period, read time, or word line settling time period is performed in FIG. 11 with a circuit structure that includes a counter circuit 1122 and logic circuitry 1124, where the counter circuit is a hardware circuit implemented using circuit components, such as flip flops, configured to receive a clock signal, count clock pulses of the received clock signal, output a count value indicative of the number of counted clock pulses, and can start and stop counting in response to a state signal received from a comparator circuit. The logic circuitry 1124 includes a buffer that stores a data structure or table that maps time durations with word line and/or bit line settling time period values. Other structures for setting a verify time, bit line settling time period, read time, or word line settling time period may be possible. For example, rather than include counter that counts using a clock signal, a voltage generator may generate a voltage that increases at a predetermined rate, such as one dependent on a resistor-capacitor (RC) time constant. When the bit line pre-charge detection circuit 1108 or the word line detection circuit 1110 changes the level of its output signal, the read/verify detection logic 1124 can identify the level of the voltage generated by the voltage generator and choose a verify time, bit line settling time period, read time, or word line settling time period that corresponds to voltage level. In addition or alternatively, other configurations of a counter may be possible, such as one implemented as a processor executing software rather than one implemented solely in hardware (e.g., one that uses flip flops or registers). In addition or alternatively, in other embodiments, the buffer 1128 in the read/verify detection logic 1124 may contain a predetermined function or functions executed by the sensing circuit controller 1006 to generate the subsequent timing adjustments for the currently active program-verify operation or read operation. The table or predetermined function may be stored in a ROM fuse or other persistent or non-volatile memory on the die and transferred to the buffer 1128 on power-up. Other circuit structures for setting a verify time, a bit line settling time period, a read time or a word line settling time period other than the configuration shown in FIG. 11 may be possible.

The verify or read timing adjustment information is sent, during the same ongoing program-verify operation or read operation, to the sense circuit controller 1006. The sense circuit controller 1006 may take the verify or read timing adjustment information and immediately set or adjust when it outputs certain control signals to perform one or more sense operations for one or more verify stages remaining to be executed in the current program-verify operation or for one or more read stages remaining to be executed in the read operation. The control signals output by the sense circuit controller 1006 will cause the sense circuit 1100 to perform a sense operation in one or more different verify stages in a program-verify operation or in one or more read stages in a read operation at an earlier or later time than in a previous program-verify operation or read operation when the detected initial bit line or word line charging time is shorter or longer than the last detected charging time, respectively.

Although both a bit line pre-charge detection circuit 1108 and a word line detection circuit 1110 are shown in FIG. 11, other arrangements of the circuitry are contemplated. For example, in one implementation the memory system may only include the bit line pre-charge detection circuit 1108 and not include a word line detection circuit 1110 so that the memory system may only adjust the timing of stages in program-verify operations. Alternatively, in other implementations the memory system may only include the word line detection circuit 1110 and not include a bit line pre-charge detection circuit 1108 so that the memory system may only adjust the timing of stages in read operations. In yet other implementations, both the bit line pre-charge detection circuit 1108 and the word line detection circuit 1110 may be included in the memory system, but each in communication with a separate dedicated timing circuit 1112 rather than sharing the same timing circuit 1112 as illustrated in FIG. 11.

As will be described in greater detail below, a slower bit line or word line response time to the initial bit line pre-charge or initial word line Vread spike charge, as measured at the beginning of a given program-verify operation or read operation, will lead to a time delay added to one or more later verify or read stages of that program-verify operation or read operation. Similarly, a faster initial response time measured in a given program-verify operation or read operation will result in one or more shortened verify or read stages later in the same program-verify operation or read operation. An overall result of the sensing of the initial bit line or word line charging time as described, with immediate determination of timing changes for later stages of the same program-verify operation or read operation, is the shortening of program-verify operations or read operations when conditions allow, and the lengthening of program-verify operations or read operations when the bit line or word line being sensed requires more time to accurately sense the status of a target memory cell.

Figure 12:
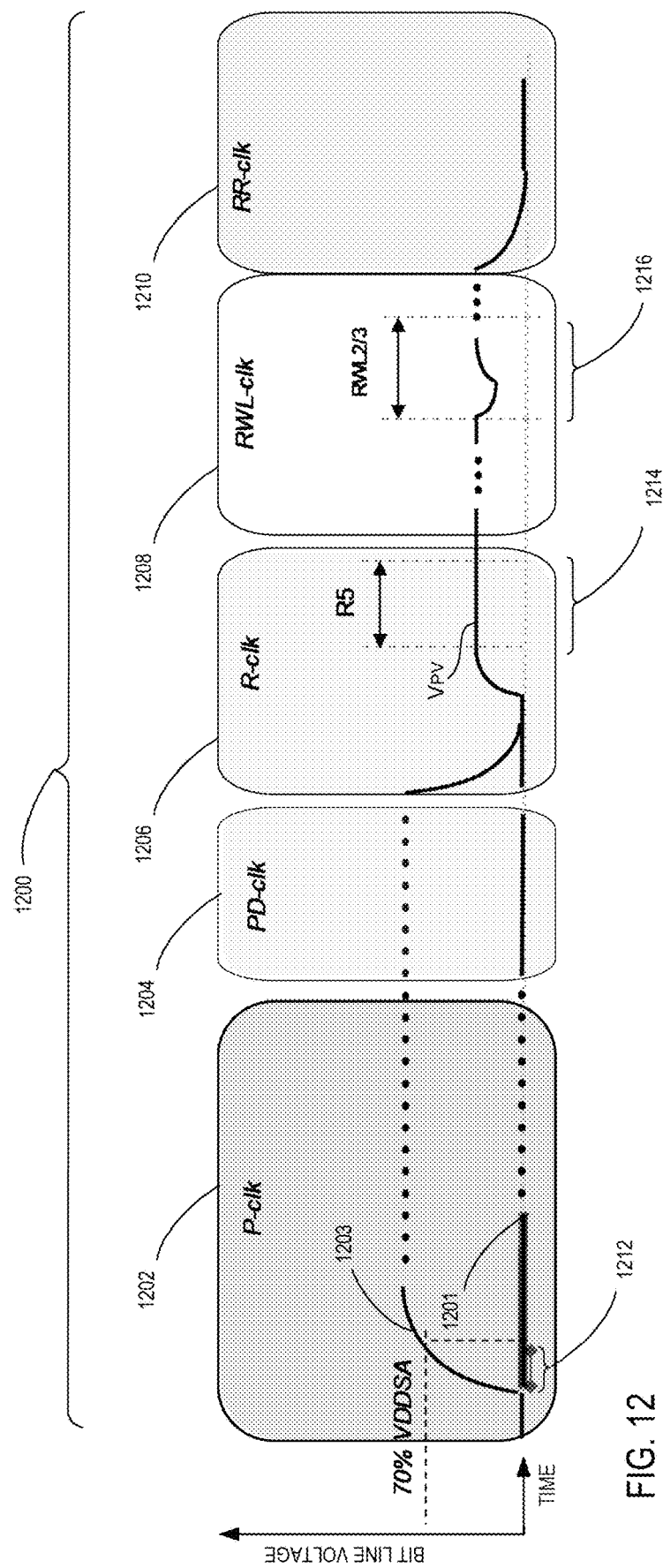
FIG. 12 is a timing diagram of a bit line waveform and timing for a program-verify operation having multiple stages of operation.

Referring now to FIG. 12, a bit line voltage sequence for a program-verify operation 1200 that may utilize the circuit of FIG. 11 is shown. The program-verify operation 1200 illustrates the voltage level over time on a selected bit line, such as BL(i), as a result of the pre-charge, programming and verify stages applied, and example timing of the various operations within the different stages of the program-verify operation 1200. The illustrated program-verify operation 1200 includes a bit line pre-charge stage (P-clk) 1202, a program stage (PD-clk) 1204, a first verify stage (R-clk) 1206, a second verify stage (RWL-clk) 1208, and a discharging stage (RR-clk) 1210. The first two stages 1202, 1204 of the program-verify operation 1200 as illustrated shows two potential paths for the voltage applied to the selected bit line: a programming path 1201 or a programming inhibit path 1203. The sense circuit controller 1006 decides which path the bit line voltage will take based on whether the target memory cell MC(T) needs more programming or has already reached its desired program state. The sense circuit controller 1006 may then send timing control signals to trigger the sense circuit 1100 and bit line and word line biasing circuits 1116, 1103 to implement the desired programming or programming inhibit path 1201, 1203 in the pre-charge stage of the program-verify operation.

The programming path 1201 represents a situation where additional charge is desired to be stored in the target memory cell MC(T) so that the target memory cell MC(T) will reach, or come closer to reaching, the desired state. The sense circuit controller 1006 triggers the bit line biasing circuit 1116 to keep the selected bit line BL(i) at the low voltage level Vpgmb (for example 0 Volts) during the pre-charge stage 1202 and the program stage 1204, so that current flows through the bit line and the target memory cell MC(T) when the selected word line WL(S) receives a programming pulse from the word line biasing circuit 1103 during the program stage 1204.

In contrast, the programming inhibit path 1203 shown in the pre-charge stage 1202 and extending through the duration of the program stage 1204 may be selected by the sense circuit controller 1006 when the target memory cell MC(T) has reached its desired charge level in a prior program-verify operation and it becomes necessary to keep subsequent word line programming pulses from affecting the now programmed cell while other cells (on other bit lines) connected to the same selected word line are still receiving programming pulses to reach their respective programming states. In the programming inhibit path 1203, the sense circuit controller 1006 may cause the bit line biasing circuit 1116 to pre-charge the selected bit line BL(i) to the high, inhibit voltage level VDDSA selected to prevent current flow through the target memory cell MC(T) in response to a word line programming pulse during the program stage 1204. As previously described, the inhibit voltage level VDDSA generated by the bit line biasing circuit 1116, may be a relatively high voltage level, such as 3 Volts. This voltage is maintained by the bit line biasing circuit 1116 via control signals from the sense circuit controller 1006 until the end of the program stage 1204, at which point the sense circuit controller 1006 causes the discharge of the bit line voltage $V_{BL}$ at the inhibit voltage level VDDSA via the sense circuit 1100.

Because program-verify operations 1200 that utilize the programming path 1201 and enable programming of the target memory cell do not pre-charge the bit line, the process described below for determining a bit line pre-charge time in the pre-charge stage 1202 and adjusting timing in subsequent verify stages of that program operation is limited to program-verify operations utilizing the programming inhibit path 1203. The process of measuring a pre-charge time 1212 for the bit-line in a pre-charge stage 1202 begins as soon as the bit-line biasing circuit 1116 begins to increase the bit line voltage $V_{BL}$ up to the high voltage level VDDSA. The sense circuit controller 1006 instructs the timing circuit 1112 to track the time duration (for example by summing the number of clock CLK cycles) from the time the bit-line biasing circuit 1116 begins the pre-charging and the counter 1122 stops to when the bit-line pre-charge detection circuit 1108 provides a signal or signal change to the counter 1122 that the pre-charge threshold or target voltage level has been reached. As shown in the example program-verify operation of FIG. 12, the pre-charge threshold or target voltage level is set at 70% of the high voltage level VDDSA, and so the pre-charge time 1212 for the bit line is the time it took the bit line to reach that pre-charge threshold or target voltage level as detected by the bit-line pre-charge detection circuit 1108.

As part of the same program-verify operation, after the pre-charge stage 1202 and the program stage 1204 (in which programming has been inhibited here), sequential verify stages 1206, 1208 may be executed in the program-verify operation 1200, followed by a final discharge stage 1210. The first and second verify stages 1206, 1208 shown are for sequentially higher read verify program states for a target memory cell MC(T), where the first program-verify stage 1206 is operative to detect whether the target memory cell MC(T) has reached the lowest programming voltage level, for example level "A" of the increasing voltage programming levels A through G of the 3 bit per cell, 8 state per cell example of FIG. 9B. The second program-verify stage is operative to detect the next higher or "B" programming level.

Only two program-verify stages are shown in FIG. 12 for ease of illustration, however in general a program-verify operation 1200 may include separate verify stages for each supported programming level for a memory cell. Accordingly, the number of different verify stages in a program-verify operation 1200 may equal the number of verify voltage levels ($V_V$) that are supported for a particular cell. As an example, the 8 state per cell arrangement of FIG. 9B includes 7 verify voltage ($V_V$) levels and may include 7 verify stages. Although a complete set of verify stages may be executed in each program-verify operation 1200 after the program stage, any of a number of optimization algorithms for limiting the verify stages executed in a given program-verify operation may be implemented by the sense circuit controller 1006 and program logic in other implementations. For example, an algorithm may be implemented limiting the verify stages executed in a given program-verify operation to those above a last detected programming state.

Referring to the first verify stage (R-clk) 1206, the bit line biasing circuit 1116 biases ith bit line BL(i) to a program-verify level and then allowed to settle during a settling period (R5) 1214, the end of which is referred to as a settled time of the first verify stage (R-clk) 1206. After the end of the settling period (R5) 1215, the sense circuit controller 1006 may cause the sense circuit 1100 to sense the state of the cell. As described previously, the sensing of the state may include the world line biasing circuit 1118 sending a read pulse on the selected word line and sensing the state of the target memory cell MC(T) to determine whether the verify voltage ($V_V$) for the target memory cell is above the erase Er state and in the "A" state. In this first verify stage 1206, as in all of the various stages included in the program-verify operation 1200, a predetermined number of portions or periods, also referred to as clocks, of each verify stage are defined. The predetermined portions of each verify stage may be a fixed sequence of activities managed by the sense circuit controller 1006 each having a separate time period duration that may include internally tracked time periods within the sense circuit controller 1006, as well as external actions executed in the sense circuit 1100 and associated circuitry in response to sense circuit control signals 1126 issued by the sense circuit controller 1006.

The second program-verify stage (RWL-clk) 1208 is similar to that of the first verify stage 1206, but is configured to sense whether the target memory cell is at a different verify voltage ($V_V$), for example the verify voltage for the "B" state (see FIG. 9B). As with the first verify stage 1206, the second verify stage 1208 includes multiple predetermined periods or portions with fixed activities and timing for those activities. Because the second verify stage 1208 is sensing for a different verify voltage level than the first verify stage 1206, the word line biasing circuit 1103 generates the word line voltage $V_{WL}$ at a different voltage level so that the selected word line WL(S), in turn, biases the target memory cell MC(T) with word line bias voltage $V_{WL}$ at the different level, as described previously. The bit line biasing circuit 1116 may generate the bit line bias voltage $V_{BL}$ at the same level as in the first verify stage (R-clk) 1206, however, as illustrated in FIG. 12.

The final stage illustrated in the example program-verify operation 1200 of FIG. 12 is a discharge stage (RR-clk) 1210 where the bit line bias voltage $V_{BL}$ is discharged down to an initial low voltage level in preparation for a next program-verify operation or read operation. As with the prior stages of the program-verify operation 1200, the discharge stage (RR-clk) 1210 may include multiple predetermined portions that are triggered by control signals from the sense circuit controller 1006, which may cause the sense circuit 1100 or another circuit coupled to the ith bit line BL(i) to discharge the bit line bias voltage $V_{BL}$ of the bit line BL(i) down to the initial low voltage level.

Figure 13:
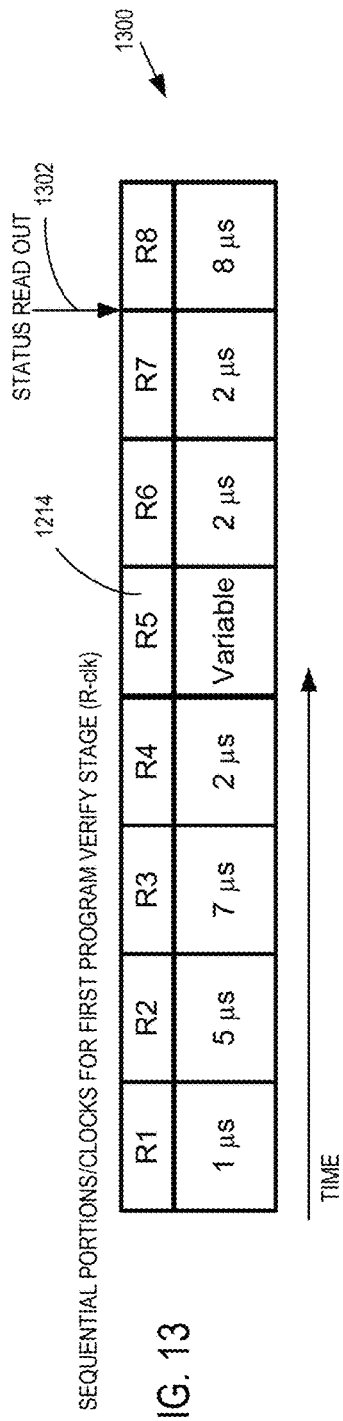
FIG. 13 is an example of the predetermined and variable timing for each sequentially portion of a first program-verify stage of a program-verify operation.

To illustrate an example of the predetermined sequence of time periods or portions (or clocks) that each verify stage of a program-verify operation may contain, a hypothetical timing chart 1300 of predefined time periods or portions of the first verify stage 1206 is shown in FIG. 13. Each of the predefined portions (R1 through R8) represent and/or has associated with it a predefined set of tasks that the sense circuit controller 1006 is to perform within the associated portion, an example task being an output of a control signal to the sense circuit 1100, the latch 1114, the bit line biasing circuit 1116, or the bit line connection circuit 1118. The sense circuit controller 1006 may be configured to execute a given portion by executing the one or more tasks associated with that portion, such as by waiting a time duration of the portion without taking any other action, or by outputting one or more control signals in the period of time defining when the portion in the verify stage occurs. In addition, the sense circuit controller 1006 may be configured to identify the sequence in which the portions are to be executed. For example, the sense circuit controller 1006 will know to execute the first portion (R1) first, then the second portion (R2) second, then the third portion (R3) third, and so on until it executes a last portion (e.g., the eight portion (R8)). In addition, the sense circuit controller 1006 is configured to identify a time duration for each of the portions. In one implementation, the sense circuit controller 1006 may execute a portion by sequentially executing one or more predefined tasks associated with the portion while tracking the passage of the time duration for that portion. For example, 1 microsecond (µs) is shown as a predetermined time duration for the first portion (R1). During that 1 µs time duration, the sense circuit controller 1006 will either wait without taking any action (e.g., without outputting any control signal), or will output at least one control signal associated with the first portion (R1). As part of executing the first portion R1, the sense circuit controller 1006 will track the passage of the 1 µs time duration, and upon expiration of the 1 µs time duration (e.g., when a clock or timer indicates that 1 µs has elapsed from the start of the first portion (R1), the sense circuit controller 1006 will automatically enter into and/or begin triggering or executing the second portion (R2) of the first read verify stage 1206. The internal clocking or timing control signal triggers for each portion continue in sequence at fixed intervals until the bit line settling time period or portion (R5) 1214, which is shown as a variable time in the sequential listing of FIG. 13. In the example timing chart 1300, the first program-verify stage 1206 is shown with additional portions/clocks (R6) and (R7) being executed in the sense circuit 1100 before the sense circuit 1100 actually reads out the status of the target memory cell MC(T) during portion/clock (R8). Accordingly, upon expiration of the seventh portion (R7), the sense circuit controller 1006 may output a sense circuit control signal 1126 to the sense circuit 1100 that causes the sense circuit 1100 to generate its sense result output signal $V_{SR}$ at a level that indicates the status of the memory cell MC(T), the amount current flowing through the ith bit line BL(i), and/or the level of the voltage generated on the internal node in response to the amount of current flow. As described, the fifth period or portion (R5) may be referred to as bit line settling period or portion 1214, at the end of which is a bit line settled time indicating that the bit line voltage $V_{BL}$ has settled to a stable level. In response to the fifth period (R5) ending (i.e., the settled time being reached), the sense circuit controller 1006 may communicate with the sense circuit 1100 and/or the latch 1114 to perform one or more actions to sense the status of the target memory cell MC(T), examples of which include outputting a sense circuit control signal 1126 to the sense circuit 1100 to form an internal current path to allow current to flow in the internal current path to the ith bit line BL(i) for a sense time period, outputting a sense circuit control signal 1126 upon expiration of the sense time period to cause the sense circuit 1100 to generate the sense result output signal $V_{SR}$ at a level indicative of the amount of current flow during the sense time period, and/or outputting one or more control signals to the latch 1114 to cause the latch 1114 to perform a read operation to read the level of the sense result output signal $V_{SR}$. Performing some or all of these actions during the fifth period (R5) and/or before the settled time is reached may lead to an incorrect identification of the status of the memory cell MC(T). In the example chart 1300, the eight number of portions included in a given verify stage of a program-verify operation may be fixed as to the number and type, but may be adjusted for different die and sense circuit designs.

Figure 14:
FIG. 14 illustrates an example table suitable for use in the timing circuit of FIG. 11, showing measured bit line pre-charge times and corresponding bit line settling time settings for multiple program-verify stages.

In addition, in the example chart 1300, the portions other than the bit line settling portion (R5) have fixed predetermined time durations, whereas the bit line settling portion (R5) has a variable time duration. That is, when the sense controller 1006 determines that the bit line settling portion (R5) 1214 has ended (the settled time has occurred) can vary from program-verify operation to program-verify operation. For each program-verify operation, the timing circuit 1112 is configured to identify the time duration for the bit line settling portion (R5) 1214 based on the measured bit line pre-charge time period 1212 in the pre-charge stage 1202. As described with respect to FIG. 11, the bit line settling time period (R5) 1214 is a function of the bit line pre-charge time period 1212, as determined by a table or algorithm maintained in the verify detection logic 1124 of the timing circuit 1112. A sample settling time adjustment table 1400 that may be maintained in a memory in the verify detection logic 1124 is shown in FIG. 14. At manufacture, the relative pre-charge time to the corresponding necessary bit line settling time mapping may be generated for each die in a storage device. The bit line settling time 1214, 1216 represents the time determined necessary to allow the bit line voltage to settle down to the desired stable bias voltage level required to reliably read/sense a memory cell on the bit line during a program-verify stage 1206, 1208.

Each of the plurality of verify stages, such as first and second program-verify stages 1206, 1208, may have a different bit line settling time 1214, 1216 for a given bit line pre-charge time 1212. An example of this is shown for the first and nth program-verify stages in the hypothetical example settling time adjustment table 1400. Alternatively, one or more of the verify stages may have the same adjustment for a given bit line pre-charge time. The settling time adjustment table 1400, or alternatively the algorithm from which to calculate the settling time adjustments from the measured bit line pre-charge time period, may be based on a default expected bit line pre-charge time period 1212, in this example 15 μs, with adjustments at even time increments above and below that default bit line pre-charge time. In the example of FIG. 14, the relationship between each increment or decrement of possible measured bit line pre-charge time periods results in a corresponding linear increment in the associated bit line settling time periods.

In other implementations, whether due to different physical design layout of the die or process or materials utilized, the values for the table entries may differ and may increment or decrement at different or non-linear amounts. The increments and general timing listed in the table 1400 is merely provided by way of example. An aspect of using the correlation of changes in bit line pre-charge time period in a pre-charge stage to changes in a bit line settling time period in a verify stage is that any of a number of factors that affect the speed of the pre-charge time period can be accounted for. For example, whether the speed of the bit line is affected by changes in temperature or other environmental factors, or whether the change is a result of the input data pattern into parallel bit lines that leads to more or less bit line to bit line coupling, the correlation between the measured bit line pre-charge time period and the corresponding bit line settling time period may inherently compensate for the faster or slower measured response of the bit line.

Figure 15:
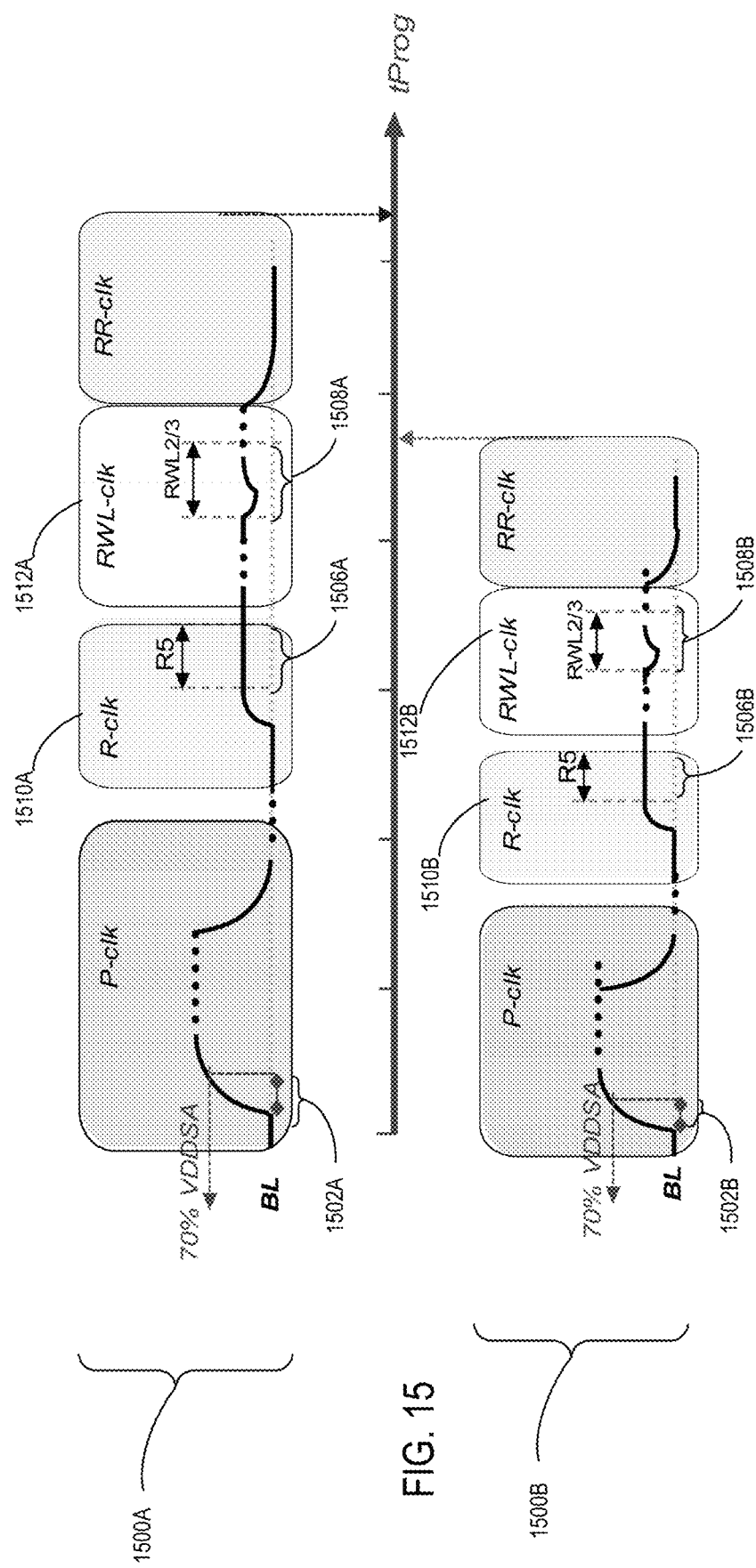
FIG. 15 illustrates a comparison of relative overall programming time and bit line voltage levels for program-verify operations having different measured bit line pre-charge times according to one embodiment.

To illustrate the general concept of slower and faster bit line pre-charge time period measurements and the resulting adjustments to the overall programming time (tprog) for a program-verify operation, a side-by side example of different program-verify operations with fast and slow bit line pre-charge measurements is shown in FIG. 15. The slower bit line pre-charge time period 1502A that is measured for the first program-verify operation 1500A results in a longer overall program time 1504 due to the resultant longer bit line settling time periods 1506A, 1508A in each of the first and second verify stages 1510A, 1512A that are necessary to take into account the current bit line speed measured. In contrast, a second program-verify operation 1500B with the same constituent stages as the first program-verify operation 1500A, but with a faster measured bit line pre-charge time period 1502B will finish faster because the bit line settling time periods 1506B, 1508B determined for the program stages of the second program-verify period will be correspondingly shorter.

It should be noted that the time changes in the two program-verify operations 1500A, 1500B correspond to the shortened or lengthened bit line settling time portions of the respective program-verify operations. The same number of clocks/portions in each stage of the two program-verify operations 1500A, 1500B are still present, but the second program-verify operation 1500B includes a shorter pre-charge portion 1502B and resulting shorter bit line settling time portions in the verify stages 1510B and 1512B that result in the same number of clocks/portions being triggered by sense circuit control signals 1126 over a shorter time frame. The control signals sent out by the sense circuit controller 1006 for the second program-verify operation 1500B are all sequentially moved up, starting after the pre-charge portion 1502B, including the bit line charge and discharge operations (shown in FIG. 15) and the associated word line pulses (not shown in FIG. 15) that must be coordinated with the bit line bias voltage level during the verify stages. Thus, other than changing the bit line settling time portion of the verify stages based on the respective initial bit line pre-charge time measurement 1502A, 1502B for each program-verify operation 1500A, 1500B, the sense circuit controller 1006 still executes the individual portions of each verify stage in the same order. The sense circuit controller 1006, in one embodiment, simply triggers the next portion of a given stage, or the next stage after completing the portions of the prior stage, at a relatively earlier or later time due to change in timing determined for the bit line settling time period(s).

Figure 16:
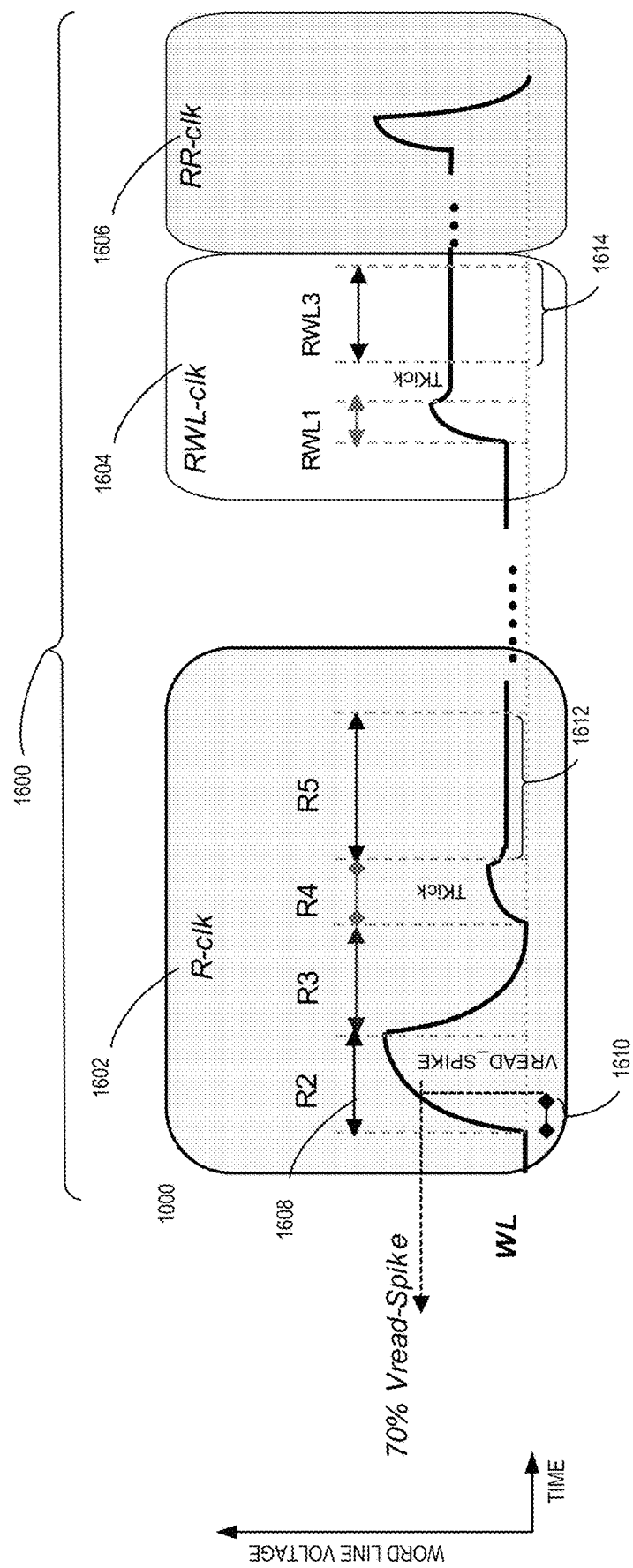
FIG. 16 is a timing diagram of a word line voltage level over time a read operation having multiple stages of operation.

Referring now to FIG. 16, a read operation 1600 with multiple stages 1602, 1604, 1606 is shown from the perspective of the word line voltage levels illustrating charging times and discharging times time periods, also referred to as word line setup and settling times and time periods, for the word line. In a read operation, read stages 1602, 1604 may be executed for reading out memory states of the target memory cells connected to the selected word line WL(S). The last stage of the read operation 1600 may be a discharge stage (RR-clk) 1606 to discharge the selected word line WL(S). Utilizing essentially the same principle as described above for program-verify operations, where a bit line speed is measured to determine the real-time capacitance affecting the bit line and then trimming or lengthening certain subsequent verify stages in the same program-verify operation as a function of the measured bit line pre-charge time, the word line detection circuit 1110 (FIG. 11) is configured to detect or measure a time duration for the word line voltage $V_{WL}$ to reach a threshold voltage level during an initial word line charging portion 1608 at the beginning of a read operation 1600 including during the initial read stage (R-clk) 1602, and the timing circuit 1112 may use the measured or detected time duration to set or determine the timing of sense operations occurring later in the initial read stage 1602 and/or in one or more later read stages, such as the second read stage 1604.

In the first read stage 1602 of the read operation, the sense circuit controller 1006 may cause the word line biasing circuit 1103 to pulse a relatively high voltage, Vread_spike, and then discharge the word line. This is shown in early periods or portions R2, R3 of the first read stage 1602. The amount of the charge time 1610 it takes for the word line to rise to a threshold voltage level relative to the high voltage Vread_spike, such as a predetermined percentage of Vread_spike, may be measured and then used to adjust the timing or certain subsequent portions of the same stage 1602 or other stages 1604, 1606 in the read operation 1600. In the example read operation 1600 of FIG. 16, the word line settling time period 1612 in portion R5 in the same read stage 1602 and the word line settling time period 1614 in portion RWL3 in the second read stage 1604 are set based on the measured charge time duration 1610 in the initial read stage 1602.

The performance issues compensated for by making the adjustments to timing in the read operation 1600 based on the initial charging time duration 1610 to a predetermined threshold include many of the same as described for the bit line pre-charge situation in the program-verify operation. For example the overall capacitance of the word line due to the location and composition of the materials for different word lines in the non-volatile memory array, and word line to word line variations may be compensated for. Additionally, block variations, die variations, wafer variations, process variations and temperature may all be compensated for with this technique. By tracking and adjusting for the speed of word lines based on charging time measured at the beginning of a given read operation 1600, a smaller die with less capacitance may automatically adjust to program and read faster than a larger die may have to have more parasitic capacitance and therefore automatically adjust itself to program or read more slowly to avoid bit errors. Slower word lines may need greater settling times before a read operation to avoid prematurely attempting to sense the programming state of a target memory cell on the selected word line when the biasing from the selected word line on that cell may not yet have settled to a reliable level.

The read operation 1600 of FIG. 16 may be implemented with the circuitry of FIG. 11. During the first read stage 1602 of the read operation 1600, the word line biasing circuit 1103 may apply a high voltage, Vread_spike, to charge the word line WL(S). When the word line biasing circuit starts applying that high voltage, for example at the beginning of portion R2 of the first read stage 1602, the counter 1122 of the timing circuit 1112 tracks the number of CLK counts until the word line detection circuit 1110 transmits a state change signal indicating that the selected word line WL(S) has reached the predetermined threshold, such as a predetermined percentage of the Vread_spike voltage, being applied. The word line detection circuit 1110 may include a comparator 1111 having a first input receiving the present voltage on the selected word line WL(S) and a second input attached to a source for the target voltage that is to be detected. Here, the target voltage at the second input of the comparator 1111 may be 70% of the Vread_spike being applied to the word line. Any of a number of other target voltage levels may be selected. Thus, the cumulative number of clock CLK pulses counted by the counter 1122 in the timing circuit 1112 at the time that the comparator 1111 output state change is triggered will represent the measured time duration for the word line voltage to rise from the initial low voltage to the predetermined threshold voltage of 70% Vread_spike.

Figure 17:
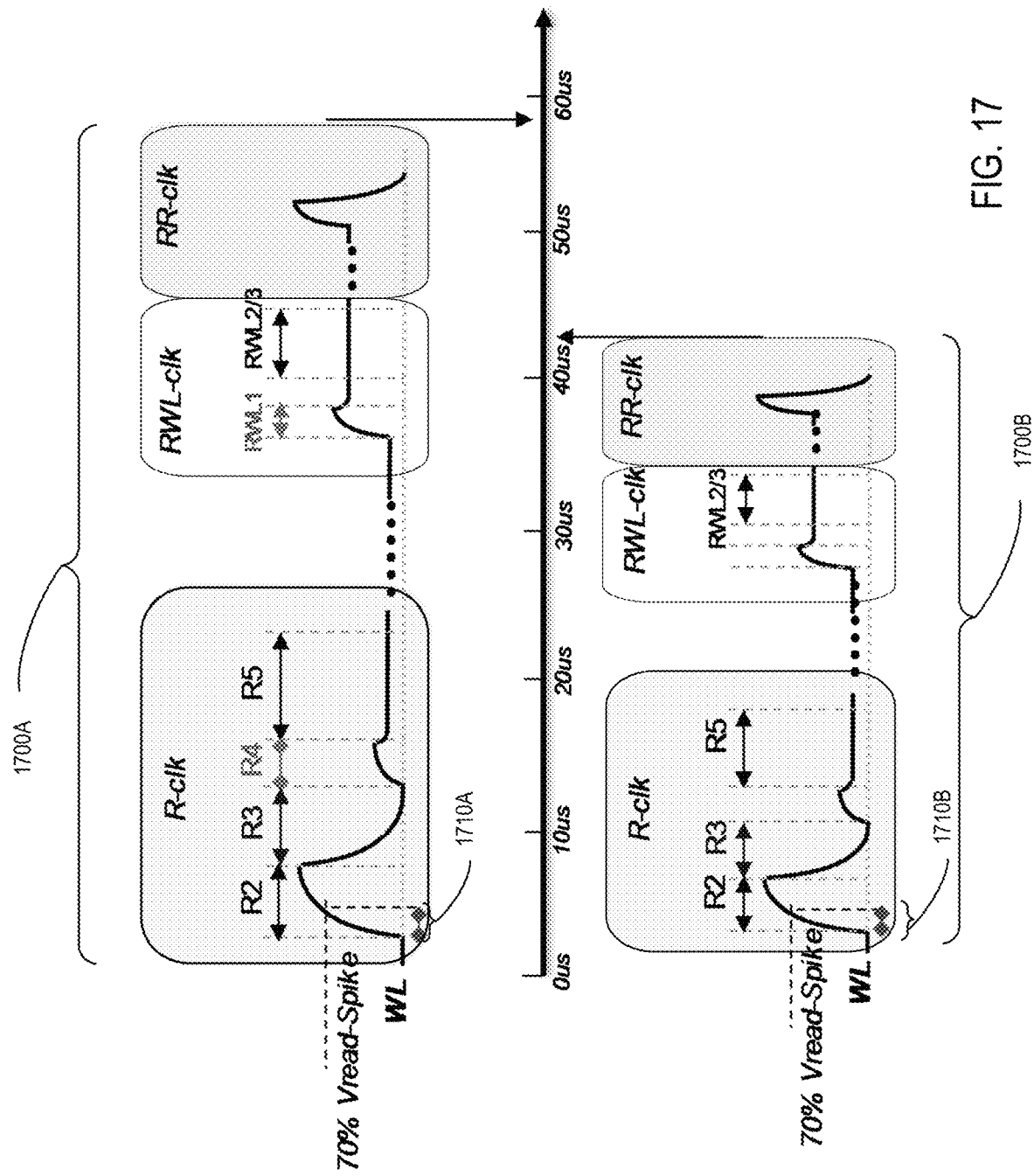
FIG. 17 illustrates a comparison of relative overall read time and word line voltage levels for read operations having different measured word line pre-charge times according to one embodiment.

The read/verify detection logic 1124 in the buffer 1128 may be executed by the timing circuit 1112 to output read timing information to the sense circuit controller 1006. The timing information may be in the form of a table, such as the table 1800 of FIG. 18, of word line charging times 1802 and the corresponding predetermined adjustments 1804, 1806 to other portions of stages of the read operation 1600. Alternatively, the timing information that the read/verify detection logic 1128 may provide may be in the form of an algorithm or function that the sense circuit controller 1006 may execute by inputting the measured time duration of the determined counter value and using applying the resulting time to the later portion of the same or different stage. In the read operation 1600 example of FIG. 16, the word line settling time 1612 of the first read stage may be adjusted based on the detected word line charge time, and the word line settling time 1614 of the second read stage 1604 in the same read operation may be adjusted. As shown in FIG. 17, the relative read operations 1700A, 1700B of different word lines having different word line charging times 1710A, 1710B. For the longer word line charging time, the subsequent word line settling times (R5 and RWL2/3) are longer than for the word line 1700B with the shorter word line charging time 1710B.

In alternative embodiments, for both the program-verify operation of FIG. 12 and the read operation of FIG. 16, one or more additional verify stage or read stage portions/clocks may also be adjusted in response to the measured initial bit line charging time (program-verify operations) or the measured initial word line charging time (read operations). The timing adjustments of the various portions of the stages in the read or program-verify operations to be made based on different word line or bit line charging measurements may all be calculated at the design and manufacturing stage and preloaded into a RomFuse memory that can be transferred to the buffer 1128 for the read/verify detection logic 1124 on power up of the memory device.

In yet other alternative embodiments, the initial bit line of word line charging measurements may be used to adjust parameters other than just timing. For example the amount of "kick" or extra amount of the applied biasing voltage to the bit line or word line above the desired biasing voltage target for a particular read or verify stage may be increased for a slow bit line or word line and decreased for a fast bit line or word line.

A circuit, system and method for performing real-time, self-adaptive bit line and word line program and read timing adjustments to adapt for the effects of manufacturing, device configuration, temperature and data pattern variations on programming and read operations has been described. By measuring how fast or slow the bit line or word line is during an initial stage of a multiple stage read or program-verify operation, and then applying one or more adjustments to later portions of the same or later stages of the same read or program-verify operation. A measure of the performance of a selected bit line (for a program-verify operation) or word line (for a read operation) may be accomplished by using a circuit to measure the time the bit line or word line takes to charge up to a respective predetermined threshold voltage at the beginning of a program-verify operation or a read operation. The initial charge time measurements represent a real-time performance measure that may then be applied to shorten or lengthen timing parameters for one or more subsequent stages of the same or later read or program-verify operation. The adjustments may be made to increase performance for faster, more responsive word lines and bit lines, and to reduce the chances of errors in read and verify operations on slower word lines and bit lines.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

The invention claimed is:

1. A circuit comprising:
   a detection circuit configured to detect a time duration for a bit line voltage of a bit line to reach a target voltage level of a predetermined threshold voltage level during a pre-charge stage of a program-verify operation for a memory cell coupled to the bit line; and
   a timing circuit configured to, based on the time duration detected, set a verify time during a verify stage of the program-verify operation.

2. The circuit of claim 1, wherein the verify stage comprises a first verify stage, the verify time comprises a first verify time, the program-verify operation further comprising a second verify stage following the first verify stage, and
   wherein the timing circuit is configured to, based on the time duration detected, set a second verify time for the second verify stage.

3. The circuit of claim 2, wherein the first verify time differs from the second verify time.

4. The circuit of claim 1, wherein the detection circuit comprises:
   a comparator having a first input in communication with the bit line and a second input in communication with a voltage reference set to the predetermined threshold voltage level; and
   wherein the comparator further comprises an output configured to transmit a state change signal in response to the bit line voltage at the first input reaching the predetermined threshold voltage level.

5. The circuit of claim 4, wherein the timing circuit comprises:
   a counter having a clock input for receiving a clock signal and a detection circuit input in communication with the output of the detection circuit; and
   wherein the counter is configured to count a number of clock pulses received at the clock input from a beginning of the pre-charge stage until the state change signal is received from the detection circuit and then output an output signal representative of the detected time duration.

6. The circuit of claim 5, wherein the timing circuit further comprises:
   verify detection logic configured to receive the output signal from the counter and generate a verify stage timing output based on the received output signal.

7. The circuit of claim 6 wherein the verify detection logic comprises a data structure mapping the detected time duration to a predetermined verify stage timing value.

8. The circuit of claim 1, further comprising:
   a sense circuit controller configured to:
      identify the verify time; and
      output a control signal in response to identification of the verify time; and
   a sense circuit configured to sense a status of the memory cell in response to receipt of the control signal.

9. The circuit of claim 1, wherein the verify stage comprises a plurality of portions, wherein at least one portion comprises an adjustable portion having an adjustable time duration; and
   wherein to set the verify time, the timing circuit is configured to output a verify timing output corresponding to the verify time that identifies a time duration for the adjustable portion.

10. A system comprising:
    a memory array comprising a plurality of memory cells;
    a plurality of bit lines connected to the plurality of memory cells;
    a detection circuit configured to detect a time duration for a bit line voltage of a bit line of the plurality of bit lines to reach a target voltage level of a predetermined threshold voltage level during a pre-charge stage of a program-verify operation;
    a timing circuit configured to, during the program-verify operation, determine a bit line settling time period for a verify stage of the program-verify operation corresponding to the detected time duration from a buffer associating a plurality of bit line settling time periods with a plurality of time durations of the pre-charge stage; and
    a sense circuit connected to the bit line, the sense circuit configured to, during the verify stage, sense a status of a memory cell coupled to the bit line relative to the bit line settling time period.

11. The system of claim 10, wherein the sense circuit comprises a first sense circuit, the memory cell comprises a first memory cell, the bit line comprises a first bit line, the bit line settling time period comprises a first bit line settling time period, and the system further comprises a second sense circuit coupled to a second bit line, and wherein the timing circuit is further configured to determine a second bit line settling time period for a second verify stage of the program-verify operation corresponding to the detected time duration from the buffer; and
    wherein the second sense circuit is configured to, during the second verify stage of the program-verify operation, sense a second status of a second memory cell relative to the second bit line settling time.

12. The system of claim 11, wherein the first bit line settling time period differs from the second bit line settling time period.

13. The system of claim 10, wherein the detection circuit comprises:
- a comparator having a first input in communication with the bit line and a second input in communication with a voltage reference set to the threshold voltage; and
- wherein the comparator further comprises an output configured to transmit a state change signal in response to a bit line voltage at the first input reaching the threshold voltage.

14. The system of claim 13, wherein the timing circuit comprises:
- a counter having a clock input for receiving a clock signal and a detection circuit input in communication with the output of the comparator; and
- wherein the counter is configured to count a number of clock pulses received at the clock input from a beginning of the pre-charge stage until the state change signal is received from the detection circuit and then output an output signal representative of the detected time duration.

15. A circuit comprising:
- means for detecting a time duration for a bit line voltage to reach a target voltage level of a predetermined threshold voltage level during a pre-charge stage of a program-verify operation;
- means for setting a verify time in a verify stage of the program-verify operation based on the detected time duration; and
- means for sensing a status of a target memory cell relative to the verify time.

16. A method comprising:
- detecting, with a detection circuit, a time at which a bit line voltage increasing from an initial level reaches a threshold level during a pre-charge stage of a program-verify operation;
- outputting, with the detection circuit, a state change signal in response to detecting that the bit line voltage reached the threshold level;
- tracking, with a counter, a number of clock pulses of a clock signal from a beginning of the pre-charge stage to when the state change signal indicates that the bit line voltage reached the threshold level;
- selecting, with verify logic, a bit line settling time period based on the number of clock pulses; and
- outputting, with a sense circuit controller, a control signal to a sense circuit in response to expiration of the bit line settling time period.

* * * * *